(12) United States Patent
K et al.

(10) Patent No.: US 10,553,301 B2
(45) Date of Patent: Feb. 4, 2020

(54) DYNAMIC READ TABLE BLOCK FILTER

(71) Applicant: SanDisk Technologies LLC, Plano, TX (US)

(72) Inventors: Narayan K, Bangalore (IN); Sateesh Desireddi, Khammam (IN); Aneesh Puthoor, Bangalore (IN); Dharmaraju Marenahally Krishna, Bengaluru (IN); Arun Thandapani, Bangalore (IN); Divya Prasad, Bengaluru (IN); Thendral Murugaiyan, Bangalore (IN); Piyush Dhotre, Bengaluru (IN)

(73) Assignee: SanDisk Technologies LLC, Addison, TX (US)

( * ) Notice: Subject to any disclaimer, the term of this patent is extended or adjusted under 35 U.S.C. 154(b) by 205 days.

(21) Appl. No.: 15/677,874

(22) Filed: Aug. 15, 2017

(65) Prior Publication Data

US 2018/0350446 A1  Dec. 6, 2018

(30) Foreign Application Priority Data

Jun. 3, 2017 (IN) .............................. 201741019548

(51) Int. Cl.
*G11C 29/38* (2006.01)
*G11C 29/44* (2006.01)
(Continued)

(52) U.S. Cl.
CPC ................ *G11C 29/38* (2013.01); *G11C 7/04* (2013.01); *G11C 29/021* (2013.01);
(Continued)

(58) Field of Classification Search
CPC ........... G11C 29/38; G11C 7/04; G11C 29/42; G11C 29/028; G11C 29/021; G11C 29/76; G11C 29/44; G11C 2029/0409
See application file for complete search history.

(56) References Cited

U.S. PATENT DOCUMENTS 6,738,287 B2  5/2004  Yano
6,888,758 B1  5/2005  Hemink et al.
(Continued)

OTHER PUBLICATIONS

U.S. Appl. No. 15/204,257 filed Jul. 7, 2016, by Costa et al., entitled "Word Line Dependent Pass Voltages in Non-volatile Memory,".

*Primary Examiner* — Cynthia Britt
(74) *Attorney, Agent, or Firm* — Vierra Magen Marcus LLP

(57) ABSTRACT

Non-volatile memory and processes for reprogramming data posing a potential reliability concern are provided. A process is provided for distinguishing between cross-temperature effects and read disturb effects as part of determining whether to perform a maintenance operation such as reprogramming. A process is provided that compensates for cross-temperature effects while testing to determine whether to perform a maintenance operation. Applying temperature compensation attempts to remove cross-temperature effects so that testing accurately detects whether read disturb has occurred, without the effects of temperature. By reducing cross-temperature effects, maintenance operations can be more accurately scheduled for memory that has experienced read disturb, as opposed to cross-temperature effects.

22 Claims, 24 Drawing Sheets

(51) Int. Cl.
    *G11C 29/00*    (2006.01)
    *G11C 29/42*    (2006.01)
    *G11C 29/02*    (2006.01)
    *G11C 7/04*     (2006.01)
    *G11C 29/04*    (2006.01)

(52) U.S. Cl.
    CPC ............ *G11C 29/028* (2013.01); *G11C 29/42* (2013.01); *G11C 29/44* (2013.01); *G11C 29/76* (2013.01); *G11C 2029/0409* (2013.01)

(56) References Cited

U.S. PATENT DOCUMENTS

| | | |
|---|---|---|
| 7,310,271 B2 | 12/2007 | Lee |
| 7,385,854 B2 | 6/2008 | Chen |
| 7,630,266 B2 | 12/2009 | Incarnati |
| 7,864,573 B2 | 1/2011 | Perlmutter et al. |
| 7,869,273 B2 | 1/2011 | Lee et al. |
| 8,385,123 B2 | 2/2013 | Jones |
| 8,542,537 B2 | 9/2013 | Parker |
| 8,611,157 B2 | 12/2013 | Dutta |
| 8,687,421 B2 | 4/2014 | Avila et al. |
| 8,755,234 B2 | 6/2014 | Oowada et al. |
| 9,530,512 B2 | 12/2016 | Ray et al. |
| 9,570,160 B1 | 2/2017 | Shah et al. |
| 9,704,588 B1* | 7/2017 | Ray .................. G11C 16/26 |
| 9,721,652 B2 | 8/2017 | Puthenthermadam et al. |
| 9,852,803 B2* | 12/2017 | Diep .................. G11C 16/08 |
| 2012/0300550 A1* | 11/2012 | Hemink ............. G11C 16/3427 365/185.17 |
| 2015/0043281 A1* | 2/2015 | Hemink .............. G11C 7/04 365/185.18 |
| 2015/0170746 A1* | 6/2015 | Oowada ............. G11C 16/10 365/185.18 |
| 2016/0054937 A1 | 2/2016 | Tuers et al. |
| 2017/0140814 A1 | 5/2017 | Puthenthermadam et al. |
| 2017/0255403 A1* | 9/2017 | Sharon ............... G06F 3/0619 |
| 2019/0043596 A1* | 2/2019 | Madraswala ...... G11C 16/3459 |
| 2019/0066792 A1* | 2/2019 | Muchherla ......... G11C 11/5628 |

* cited by examiner

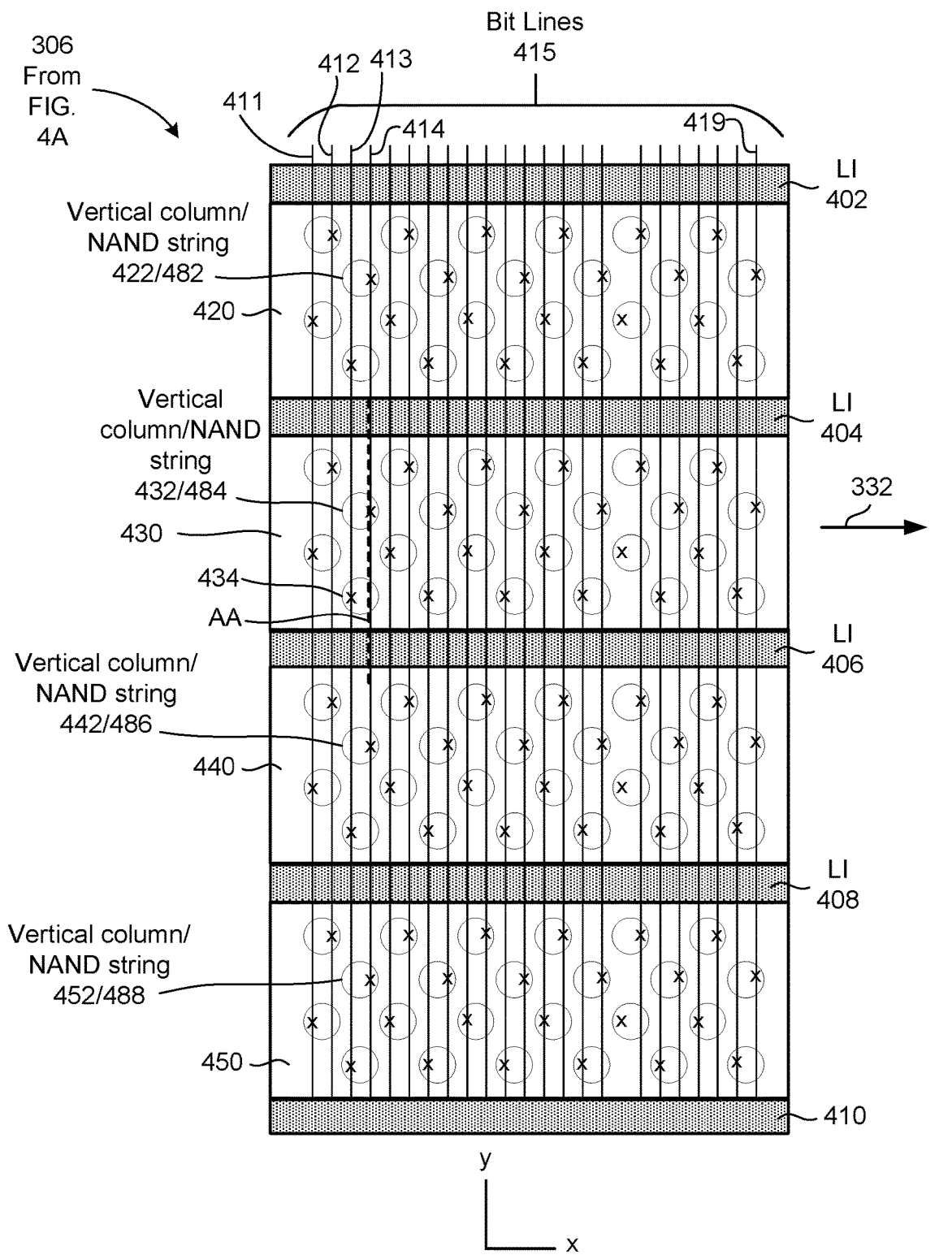

FIG. 4D
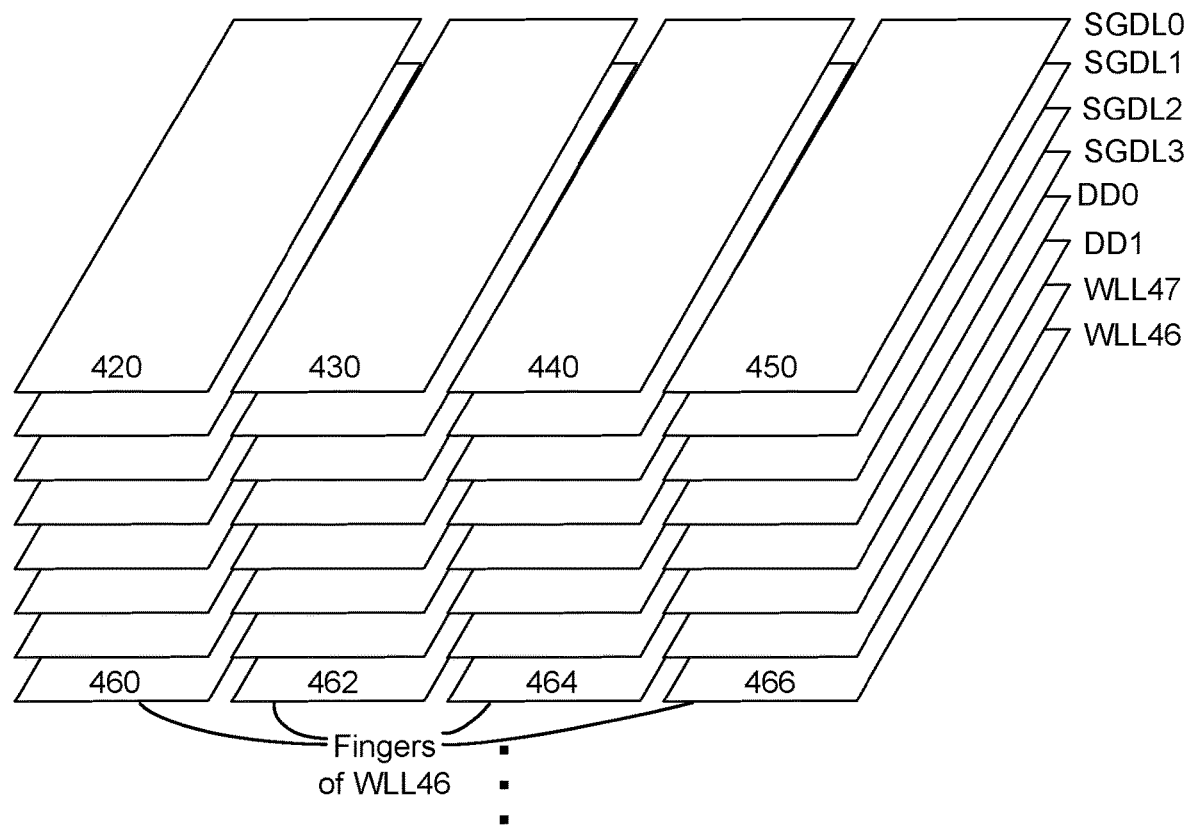
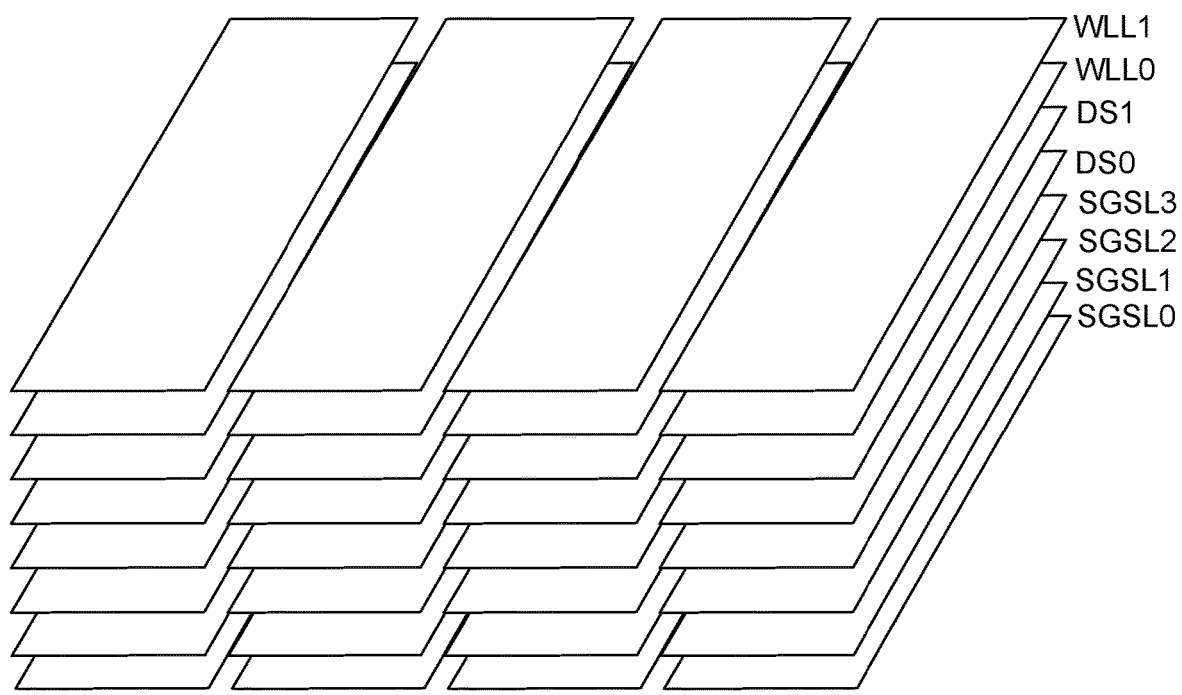

| | State A | State B | State C |
|---|---|---|---|
| Default Reference Levels | VrA | VrB | VrC |
| Compensated Reference Levels | VrA | VrB+100mv | VrC+100mv |

| Cases | VrA (Shifts in mv) | VrB (Shifts in mv) | VrC (Shifts in mv) |
|---|---|---|---|
| 0 | 0 | 100 | 100 |
| 1 | 0 | 150 | 150 |
| 2 | 0 | 200 | 200 |
| 3 | 0 | 250 | 250 |
| 4 | 0 | 300 | 300 |

*FIG. 15*

FIG. 17A — Read Disturb

| A-C / VrA Shifts → / VrC Shifts ↑ | -50 | 0 | 50 | 100 | 150 | 200 | 250 | 300 |
|---|---|---|---|---|---|---|---|---|
| -50 | 261 | 1389 | 790 | 459 | 152 | 36 | 4 | 0 |
| 0 | 3481 | 21903 | 13595 | 8413 | 3329 | 752 | 99 | 1 |
| 50 | 8297 | 56331 | 37529 | 24006 | 10093 | 2308 | 250 | 12 |
| 100 | 19173 | 133608 | 94970 | 62885 | 26353 | 6268 | 687 | 28 |
| 150 | 32487 | 231581 | 179234 | 123990 | 53662 | 13146 | 1441 | 51 |
| 200 | 36058 | 267463 | 230007 | 166889 | 74848 | 18355 | 2064 | 65 |
| 250 | 24859 | 193810 | 189960 | 145958 | 68443 | 17321 | 2010 | 63 |
| 300 | 8367 | 71785 | 81537 | 67825 | 33596 | 8973 | 907 | 29 |

FIG. 17B — Cross-Temperature

| A-C / VrA Shifts → / VrC Shifts ↑ | -50 | 0 | 50 | 100 | 150 | 200 | 250 | 300 |
|---|---|---|---|---|---|---|---|---|
| -150 | 233 | 1238 | 1451 | 1488 | 1006 | 508 | 210 | 59 |
| -100 | 1667 | 7352 | 7856 | 6793 | 4323 | 1923 | 721 | 166 |
| -50 | 11432 | 46162 | 48966 | 41581 | 22732 | 10696 | 3734 | 994 |
| 0 | 75780 | 382827 | 532151 | 624022 | 527588 | 345760 | 165159 | 5129 |
| 50 | 48448 | 225521 | 261818 | 259611 | 146845 | 71656 | 30780 | 10773 |
| 100 | 36879 | 178462 | 222477 | 214761 | 135608 | 68018 | 29023 | 9786 |
| 150 | 17095 | 90401 | 128082 | 140674 | 103977 | 58379 | 24487 | 7981 |
| 200 | 4105 | 25490 | 45090 | 64071 | 61656 | 41654 | 18944 | 6212 |

DYNAMIC READ TABLE BLOCK FILTER

CLAIM OF PRIORITY

The present application claims priority under 35 U.S.C. § 119 from India Provisional Patent Application No. 201741019548, entitled "Dynamic Read Table Block Filter," filed Jun. 3, 2017, incorporated by reference herein in its entirety.

BACKGROUND OF THE INVENTION

Semiconductor memory devices have become more popular for use in various electronic devices. For example, non-volatile semiconductor memory is used in cellular telephones, digital cameras, personal digital assistants, mobile computing devices, non-mobile computing devices and other devices. Flash memory is among the most popular non-volatile semiconductor memories.

Some non-volatile memory devices are used to store two ranges of charges and, therefore, the memory cells can be programmed/erased between two data states: an erased state and a programmed state (corresponding to data "1" and data "0"). Such a device is referred to as a binary device or a single-level cell (SLC) and the data is binary data.

A multi-state flash memory cell (storing multi-state data) is implemented by identifying multiple, distinct allowed threshold voltage ranges (ie data states). Each distinct threshold voltage range corresponds to a predetermined value for the set of data bits. For example, some memory cells can store two bits, and others can store three bits. The specific relationship between the data programmed into the memory cell and the threshold voltage ranges (also called data states) of the memory cell depends upon the data encoding scheme adopted for the memory cells. For example, U.S. Pat. No. 6,222,762 and U.S. Patent Application Publication No. 2004/0255090, both describe various data encoding schemes for multi-state flash memory cells.

In addition to the gains in capacity resulting from multi-state memory architectures, consumers have seen significant advantages as a result of a history of steadily scaling down the physical dimensions of memory cells. Smaller memory cells can be packed more densely on a given die area, allowing the user to access more memory capacity for the same price as an older memory technology. In order to achieve the advantage of higher memory capacity for a fixed die size, these smaller memory cells must be packed more closely together. Doing so, however, may result in a greater number of operational errors, such as errors when programming data to the memory and/or reading back user data from the memory. The errors may result in increased processing times to recover the data, or in some instances a corruption of data that has been stored.

Once a non-volatile storage element has been programmed, it is important that its programming state can be read back with a high degree of reliability. However, the programming state that is read can sometimes vary from the intended programming state due to factors including noise and the tendency of devices to gravitate towards charge neutrality over time.

Consequently, it is common for to encounter erroneous or corrupted data bits at the time of reading non-volatile memory. Typically, some form of error correction control (ECC) is applied to correct erroneous or corrupted data. One common control stores additional parity bits to set the parity of a group of data bits to a required logical value when the data is written. The informational and parity bits form an encoded word stored during the write process. The ECC decodes the bits by computing the parity of the group of bits when reading the data to detect any corrupted or erroneous data. Despite these considerations, there remains a need for improved memory operations in non-volatile memory.

BRIEF DESCRIPTION OF THE DRAWINGS

Like-numbered elements refer to common components in the different figures.

FIG. 4B depicts a top view of a portion of a block of memory cells.

FIG. 4D depicts a view of the select gate layers and word line layers.

FIG. 15 is a table depicting a set of adjusted read levels for multiple read cases in accordance with one embodiment.

FIG. 17A is a table depicting results of reading with adjusted read levels for memory cells that have experienced read disturb.

FIG. 17B is a table depicting results of reading with adjusted read levels for memory cells that have experienced cross-temperature effects.

DETAILED DESCRIPTION

Figure 1:
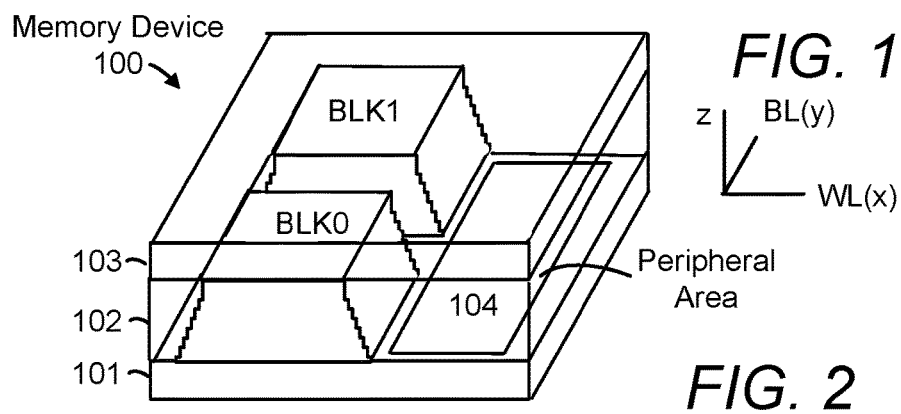
FIG. 1 is a perspective view of a 3D stacked non-volatile memory device.

The disclosed technology is directed to data integrity in non-volatile volatile memory. Data stored in non-volatile memory may be disturbed or corrupted for many reasons. Data stored in a non-volatile memory may undergo a maintenance operation to avoid or correct these effects. For example, memory cells may have their data refreshed or rewritten in the same or a different memory location. During a read scrub process, for example, data that is close to exceeding a memory's error correction capability can be identified and the content reprogrammed to the same or a new location. Read scrub operations target read disturb effects in non-volatile memory to reprogram data when read disturb effects may cause the data to exceed the error correction capability of the memory. A read scrub of data makes the data more reliable for use later.

Data in non-volatile memory may not only be corrupted as a result of read disturb, but also as a result of cross-temperature effects. Cross-temperature effects may arise due to differences in temperature between the time memory is programmed and the time the memory is read. Cross-temperature effects and read disturb have similar signatures. As a result, traditional maintenance operations may detect a cross-temperature effect as a read disturb effect. This may result in memory unnecessarily being subjected to a maintenance operation such as read scrub in response to cross-temperature effects.

The disclosed technology is directed to temperature-compensated test processes to determine whether to perform a maintenance operation for a group of a memory cells. A test process compensates for cross-temperature effects that may be experienced by the group of memory cells. In this manner, the system can more accurately detect whether the memory has been subjected to read disturb and should undergo a maintenance operation, or whether the memory is experiencing cross-temperature effects and should not undergo the operation.

In one embodiment, the system detects an error associated with testing a group of a memory cells while compensating for a cross-temperature effect. If the error satisfies (e.g., meets or exceeds) a threshold under application of temperature compensation, the group can be designated for reprogramming and later reprogrammed. If the error does not satisfy (e.g., is below) the threshold, the group of memory cells is not subjected to a read scrub process. If the group has previously been identified for reprogramming, a designation for reprogramming can be removed.

In one example, a group of memory cells is initially identified for a read scrub operation, for example by setting a flag or adding the group to a read scrub queue. The group of memory cells is later tested while compensating for a cross-temperature effect. If the error is below the threshold while compensating for the cross-temperature effect, the indication that the group of memory cells should be scrubbed is removed, for example by removing the flag or removing the group from the queue.

In one embodiment, the group of memory cells is first tested without compensation after determining that the group is identified for a read scrub operation. If the error when reading without compensation is below the threshold, it can be determined not to scrub the group.

In one embodiment, testing may include sensing memory cells as part of read, verify, scan or other operations. Applying temperature compensation can include using one or more compensated read, verify, or other levels. The compensated level is an adjusted level that is offset from a default level in one embodiment. Testing with a compensated level can include using various sense compensation parameters during reading, verifying, or other operations to determine an error associated with memory. For example, an adjusted reference voltage can be applied to a selected word line. In other examples, adjusted currents, sense times, bit line voltages, or any other level associated with determining state information associated with memory cells can be used to sense using an adjusted reference level.

In one embodiment, temperature compensation is designed to compensate for cross-temperature effects without compensating for read disturb effects. For example, cross-temperature effects may cause the threshold voltages of memory cells programmed for each state to increase by a similar amount. However, read-disturb effects may cause the threshold voltages of memory cells programmed to one state to increase by a smaller amount when compared to the threshold voltages of memory cells programmed to another state.

In one embodiment, temperature compensation is applied while sensing for a selected subset of states, but not while sensing for all states. Sensing can be performed during reading, verifying, or other operations as part of a test process. For example, the system may determine an amount of error associated with a group of memory cells by testing while providing a compensation for the states having larger cross-temperature effects, and not providing a compensation for states having smaller cross-temperature effects. If the error is below the threshold, it indicates that the group of memory cells may have initially been identified for a maintenance operation because of cross-temperature effects and not read disturb effects. Accordingly, the indication that the group of memory cells should undergo the maintenance operation can be removed.

FIGS. 1-4F describe one example of a memory system that can be used to implement the technology disclosed herein. FIG. 1 is a perspective view of a three dimensional (3D) stacked non-volatile memory device. The memory device 100 includes a substrate 101. On and above the substrate are example blocks BLK0 and BLK1 of memory cells (non-volatile storage elements). Also on substrate 101 is peripheral area 104 with support circuits for use by the blocks. Substrate 101 can also carry circuits under the blocks, along with one or more lower metal layers which are patterned in conductive paths to carry signals of the circuits. The blocks are formed in an intermediate region 102 of the memory device. In an upper region 103 of the memory device, one or more upper metal layers are patterned in conductive paths to carry signals of the circuits. Each block comprises a stacked area of memory cells, where alternating levels of the stack represent word lines. While two blocks are depicted as an example, additional blocks can be used, extending in the x- and/or y-directions.

In one example implementation, the length of the plane in the x-direction, represents a direction in which signal paths for word lines extend (a word line or SGD line direction), and the width of the plane in the y-direction, represents a direction in which signal paths for bit lines extend (a bit line direction). The z-direction represents a height of the memory device.

Figure 2:
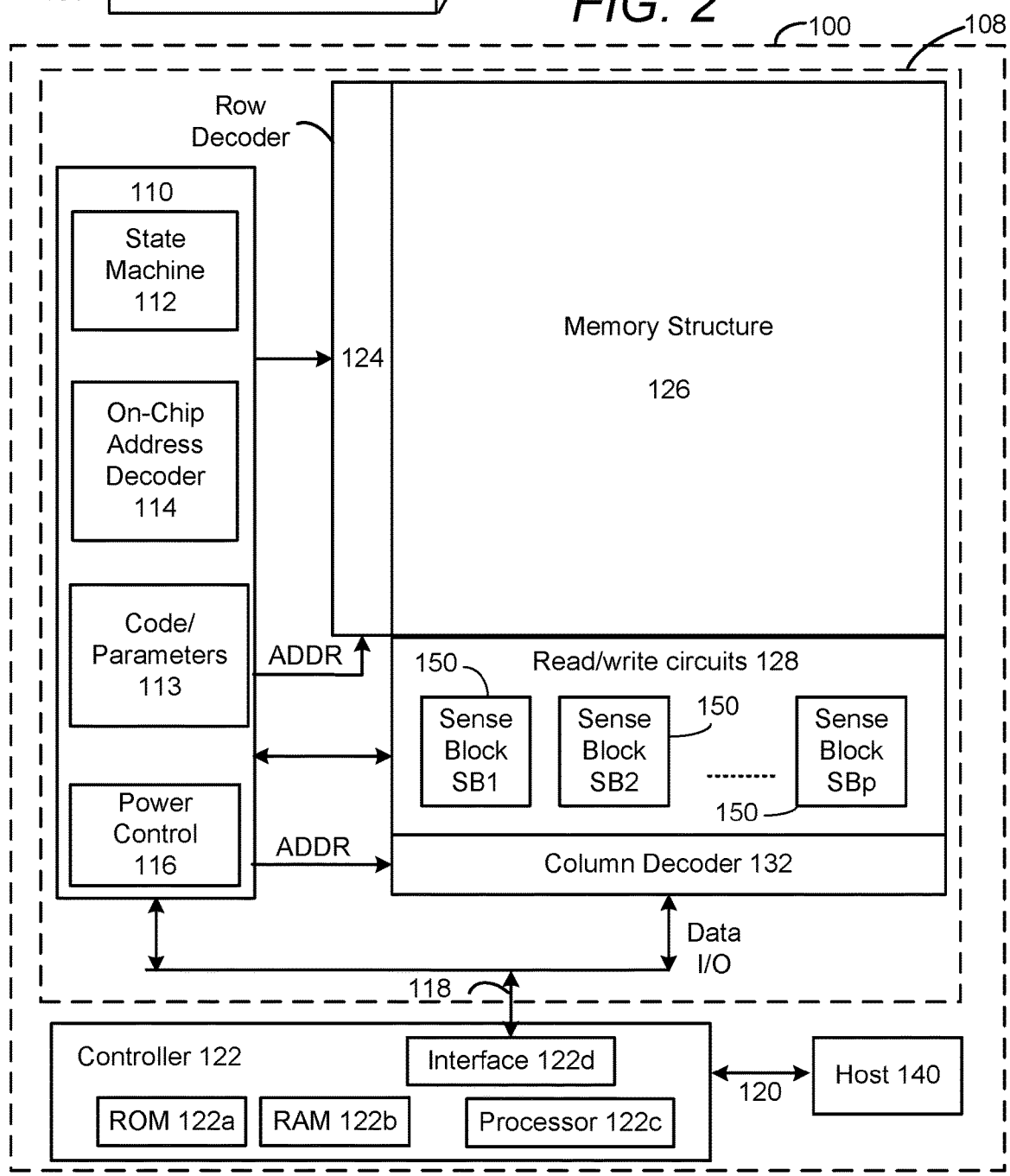
FIG. 2 is a functional block diagram of a memory device such as the 3D stacked non-volatile memory device 100 of FIG. 1.

FIG. 2 is a functional block diagram of an example memory device such as the 3D stacked non-volatile memory device 100 of FIG. 1. The components depicted in FIG. 2 are electrical circuits. Memory device 100 includes one or more memory die 108. Each memory die 108 includes a three dimensional memory structure 126 of memory cells (such as, for example, a 3D array of memory cells), control circuitry 110, and read/write circuits 128. In other embodiments, a two dimensional array of memory cells can be used. Memory structure 126 is addressable by word lines via a row decoder 124 and by bit lines via a column decoder 132. The read/write circuits 128 include multiple sense blocks 150 including SB1, SB2, . . . , SBp (sensing circuitry) and allow a page of memory cells to be read or programmed in parallel. In some systems, a controller 122 is included in the same memory device 100 (e.g., a removable storage card) as the one or more memory die 108. However, in other systems, the controller can be separate from the memory die 108. In some embodiments the controller will be on a different die than the memory die. In some embodiments, one controller 122 will communicate with multiple memory die 108. In other embodiments, each memory die 108 has its own controller. Commands and data are transferred between the host 140 and Controller 122 via a data bus 120, and between controller 122 and the one or more memory die 108 via lines 118. In one embodiment, memory die 108 includes a set of input and/or output (I/O) pins that connect to lines 118.

Memory structure 126 may comprise one or more arrays of memory cells including a 3D array. The memory structure may comprise a monolithic three dimensional memory structure in which multiple memory levels are formed above (and not in) a single substrate, such as a wafer, with no intervening substrates. The memory structure may comprise any type of non-volatile memory that is monolithically formed in one or more physical levels of arrays of memory cells having an active area disposed above a silicon substrate. The memory structure may be in a non-volatile memory device having circuitry associated with the operation of the memory cells, whether the associated circuitry is above or within the substrate.

Control circuitry 110 cooperates with the read/write circuits 128 to perform memory operations (e.g., erase, program, read, and others) on memory structure 126, and includes a state machine 112, an on-chip address decoder 114, and a power control module 116. The state machine 112 provides chip-level control of memory operations. Code and parameter storage 113 may be provided for storing operational parameters and software. In one embodiment, state machine 112 is programmable by the software stored in code and parameter storage 113. In other embodiments, state machine 112 does not use software and is completely implemented in hardware (e.g., electrical circuits).

In one embodiment, state machine 112 is programmable by software and/or firmware stored in a storage area of control circuitry 110. The storage may store operational parameters and software which is used to program state machine 112. In other embodiments, state machine 112 does not use software and is completely implemented in hardware (e.g., electrical circuits). In one embodiment, control circuitry 110 includes registers, ROM fuses and other storage devices for storing default values such as base voltages and other parameters.

The on-chip address decoder 114 includes a memory interface that provides an address interface between addresses used by host 140 or Controller 122 to the hardware address used by the decoders 124 and 132. Power control module 116 controls the power and voltages supplied to the word lines and bit lines during memory operations. It can include drivers for word line layers (discussed below) in a 3D configuration, select transistors (e.g., SGS and SGD transistors, described below) and source lines. Power control module 116 may include charge pumps for creating voltages. The sense blocks include bit line drivers. An SGS transistor is a select gate transistor at a source end of a NAND string, and an SGD transistor is a select gate transistor at a drain end of a NAND string.

Any one or any combination of control circuitry 110, state machine 112, decoders 114/124/132, code and parameter storage 113, power control module 116, sense blocks 150, read/write circuits 128, and controller 122 can be considered one or more control circuits (or a managing circuit) that perform the functions described herein. Reference to a control circuit or the control circuit is intended to refer to one or more control circuits. The control circuit includes a plurality of electronic components that provide multiple current paths for complex operations on the memory die 108 and/or off the memory die (e.g., by controller 122). In this manner, a circuit is a well-understood physical structure requiring electronic components and an interconnection of the components by vias, paths, and/or wires through which current flows.

The (on-chip or off-chip) controller 122 (which in one embodiment is an electrical circuit) may comprise a processor 122c, ROM 122a, RAM 122b and a Memory Interface 122d, all of which are interconnected. Processor 122C is one example of a control circuit. Other embodiments can use state machines or other custom circuits designed to perform one or more functions. The storage devices (ROM 122a, RAM 122b) comprise code such as a set of instructions, and the processor 122c is operable to execute the set of instructions to provide the functionality described herein. Alternatively or additionally, processor 122c can access code from a storage device in the memory structure, such as a reserved area of memory cells connected to one or more word lines. Memory interface 122d, in communication with ROM 122a, RAM 122b and processor 122c, is an electrical circuit that provides an electrical interface between Controller 122 and memory die 108. For example, memory interface 122d can change the format or timing of signals, provide a buffer, isolate from surges, latch I/O, etc. Processor 122C can issue commands to control circuitry 110 (or any other component of memory die 108) via Memory Interface 122d.

Multiple memory elements in memory structure 126 may be configured so that they are connected in series or so that each element is individually accessible. By way of non-limiting example, flash memory devices in a NAND configuration (NAND flash memory) typically contain memory elements connected in series. A NAND string is an example of a set of series-connected memory cells and select gate transistors.

A NAND flash memory array may be configured so that the array is composed of multiple NAND strings of which a NAND string is composed of multiple memory cells sharing a single bit line and accessed as a group. Alternatively, memory elements may be configured so that each element is individually accessible, e.g., a NOR memory array. NAND and NOR memory configurations are exemplary, and memory cells may be otherwise configured.

The memory cells may be arranged in the single memory device level in an ordered array, such as in a plurality of rows and/or columns. However, the memory elements may be arrayed in non-regular or non-orthogonal configurations, or in structures not considered arrays.

A three dimensional memory array is arranged so that memory cells occupy multiple planes or multiple memory device levels, thereby forming a structure in three dimensions (i.e., in the x, y and z directions, where the z direction is substantially perpendicular and the x and y directions are substantially parallel to the major surface of the substrate).

As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in the y direction) with each column having multiple memory cells. The vertical columns may be arranged in a two dimensional configuration, e.g., in an x-y plane, resulting in a three dimensional arrangement of memory cells, with memory cells on multiple vertically stacked memory planes. Other configurations of memory elements in three dimensions can also constitute a three dimensional memory array.

By way of non-limiting example, in a three dimensional NAND memory array, the memory elements may be coupled together to form a vertical NAND string that traverses across multiple horizontal memory device levels. Other three dimensional configurations can be envisioned wherein some NAND strings contain memory elements in a single memory level while other strings contain memory elements which span through multiple memory levels. Three dimensional memory arrays may also be designed in a NOR configuration and in a ReRAM configuration.

A person of ordinary skill in the art will recognize that the technology described herein is not limited to a single specific memory structure, but covers many relevant memory structures within the spirit and scope of the technology as described herein and as understood by one of ordinary skill in the art.

Figure 3:
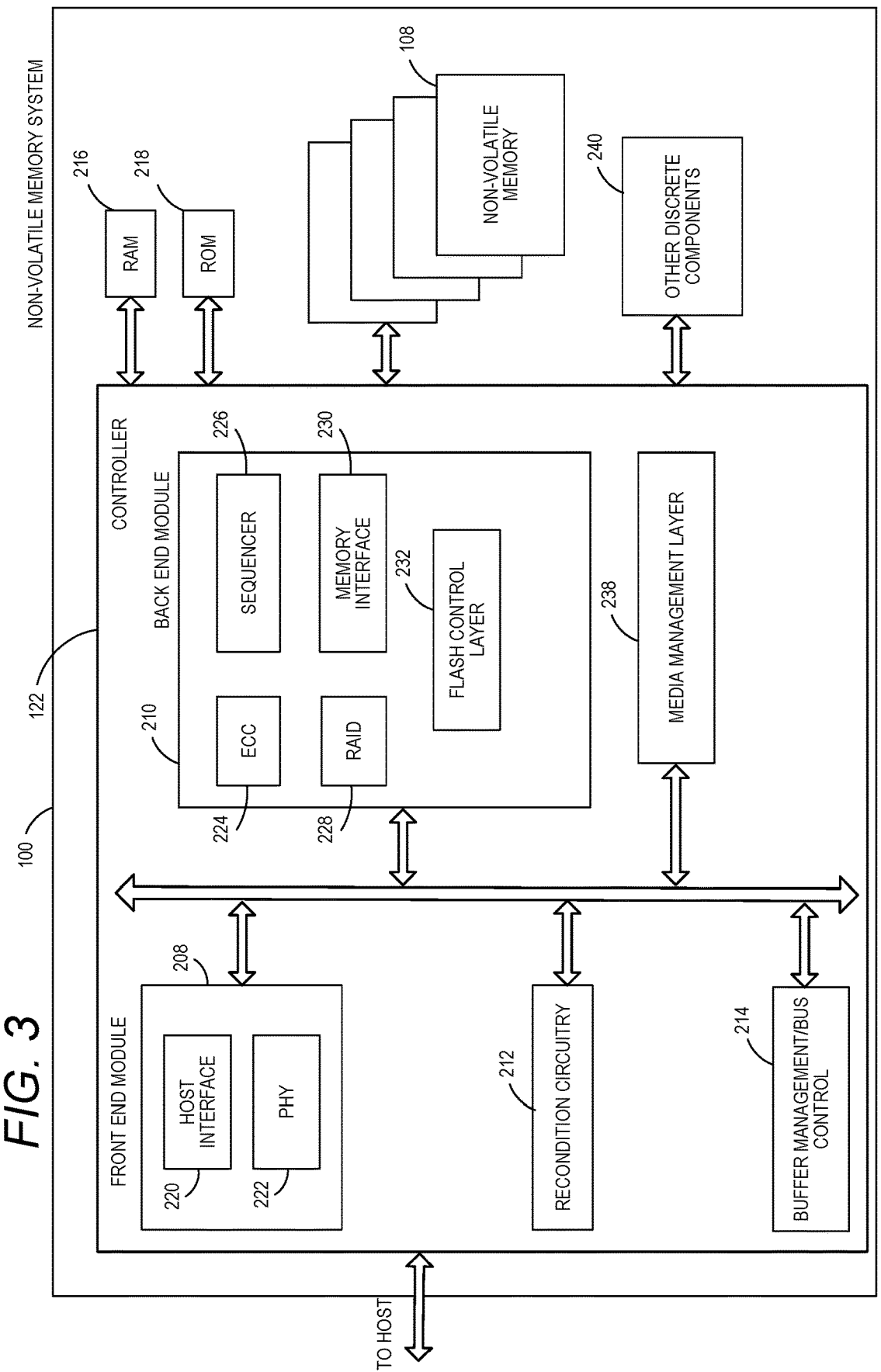
FIG. 3 is a block diagram depicting one embodiment of a controller.

FIG. 3 is a block diagram of example memory system 100, depicting more details of controller 122. As used herein, a flash memory controller is a device that manages data stored on flash memory and communicates with a host, such as a computer or electronic device. A flash memory controller can have various functionality in addition to the specific functionality described herein. For example, the flash memory controller can format the flash memory to ensure the memory is operating properly, map out bad flash memory cells, and allocate spare memory cells to be substituted for future failed cells. Some part of the spare cells can be used to hold firmware to operate the flash memory controller and implement other features. In operation, when a host needs to read data from or write data to the flash memory, it will communicate with the flash memory controller. If the host provides a logical address to which data is to be read/written, the flash memory controller can convert the logical address received from the host to a physical address in the flash memory. (Alternatively, the host can provide the physical address). The flash memory controller can also perform various memory management functions, such as, but not limited to, wear leveling (distributing writes to avoid wearing out specific blocks of memory that would otherwise be repeatedly written to) and garbage collection (after a block is full, moving only the valid pages of data to a new block, so the full block can be erased and reused).

The interface between controller 122 and non-volatile memory die 108 may be any suitable flash interface, such as Toggle Mode 200, 400, or 800. In one embodiment, memory system 100 may be a card based system, such as a secure digital (SD) or a micro secure digital (micro-SD) card. In an alternate embodiment, memory system 100 may be part of an embedded memory system. For example, the flash memory may be embedded within the host, such as in the form of a solid state disk (SSD) drive installed in a personal computer.

In some embodiments, non-volatile memory system 100 includes a single channel between controller 122 and non-volatile memory die 108, the subject matter described herein is not limited to having a single memory channel. For example, in some memory system architectures, 2, 4, 8 or more channels may exist between the controller and the memory die, depending on controller capabilities. In any of the embodiments described herein, more than a single channel may exist between the controller and the memory die, even if a single channel is shown in the drawings.

As depicted in FIG. 3, controller 122 includes a front end module 208 that interfaces with a host, a back end module 210 that interfaces with the one or more non-volatile memory die 108, and various other modules that perform functions which will now be described in detail.

The components of controller 122 depicted in FIG. 3 may take the form of a packaged functional hardware unit (e.g., an electrical circuit) designed for use with other components, a portion of a program code (e.g., software or firmware) executable by a (micro)processor or processing circuitry that usually performs a particular function of related functions, or a self-contained hardware or software component that interfaces with a larger system, for example. For example, each module may include an application specific integrated circuit (ASIC), a Field Programmable Gate Array (FPGA), a circuit, a digital logic circuit, an analog circuit, a combination of discrete circuits, gates, or any other type of hardware or combination thereof. Alternatively or in addition, each module may include software stored in a processor readable device (e.g., memory) to program a processor for controller 122 to perform the functions described herein. The architecture depicted in FIG. 3 is one example implementation that may (or may not) use the components of controller 122 depicted in FIG. 2 (i.e. RAM, ROM, processor, interface).

Controller 122 may include recondition circuitry 212, which is used for reconditioning memory cells or blocks of memory. The reconditioning may include refreshing data in its current location or reprogramming data into a new word line or block as part of performing erratic word line maintenance, as described below.

Referring again to modules of the controller 122, a buffer manager/bus controller 214 manages buffers in random access memory (RAM) 216 and controls the internal bus arbitration of controller 122. A read only memory (ROM) 218 stores system boot code. Although illustrated in FIG. 3 as located separately from the Controller 122, in other embodiments one or both of the RAM 216 and ROM 218 may be located within the controller. In yet other embodiments, portions of RAM and ROM may be located both within the controller 122 and outside the controller. Further, in some implementations, the controller 122, RAM 216, and ROM 218 may be located on separate semiconductor die.

Front end module 208 includes a host interface 220 and a physical layer interface (PHY) 222 that provide the electrical interface with the host or next level storage controller. The choice of the type of host interface 220 can depend on the type of memory being used. Examples of host interfaces 220 include, but are not limited to, SATA, SATA Express, SAS, Fibre Channel, USB, PCIe, and NVMe. The host interface 220 typically facilitates transfer for data, control signals, and timing signals.

Back end module 210 includes an error correction control (ECC) engine 224 that encodes the data bytes received from the host, and decodes and error corrects the data bytes read from the non-volatile memory. A command sequencer 226 generates command sequences, such as program and erase command sequences, to be transmitted to non-volatile memory die 108. A RAID (Redundant Array of Independent Dies) module 228 manages generation of RAID parity and recovery of failed data. The RAID parity may be used as an additional level of integrity protection for the data being written into the non-volatile memory system 100. In some cases, the RAID module 228 may be a part of the ECC engine 224. Note that the RAID parity may be added as an extra die or dies as implied by the common name, but it may also be added within the existing die, e.g. as an extra plane, or extra block, or extra WLs within a block. A memory interface 230 provides the command sequences to non-volatile memory die 108 and receives status information from non-volatile memory die 108. In one embodiment, memory interface 230 may be a double data rate (DDR) interface, such as a Toggle Mode 200, 400, or 800 interface. A flash control layer 232 controls the overall operation of back end module 210.

Additional components of system 100 illustrated in FIG. 3 include media management layer 238, which performs wear leveling of memory cells of non-volatile memory die 108. System 100 also includes other discrete components 240, such as external electrical interfaces, external RAM, resistors, capacitors, or other components that may interface with controller 122. In alternative embodiments, one or more of the physical layer interface 222, RAID module 228, media management layer 238 and buffer management/bus Controller 214 are optional components that are not necessary in the Controller 122.

The Flash Translation Layer (FTL) or Media Management Layer (MML) 238 may be integrated as part of the flash management that may handle flash errors and interfacing with the host. In particular, MML may be a module in flash management and may be responsible for the internals of NAND management. In particular, the MML 238 may include an algorithm in the memory device firmware which translates writes from the host into writes to the flash memory 126 of die 108. The MML 238 may be needed because: 1) the flash memory may have limited endurance; 2) the flash memory 126 may only be written in multiples of pages; and/or 3) the flash memory 126 may not be written unless it is erased as a block. The MML 238 understands these potential limitations of the flash memory 126 which may not be visible to the host. Accordingly, the MML 238 attempts to translate the writes from host into writes into the flash memory 126. As described below, erratic bits may be identified and recorded using the MML 238. This recording of erratic bits can be used for evaluating the health of blocks and/or word lines (the memory cells on the word lines).

Controller 122 may interface with one or more memory dies 108. In in one embodiment, Controller 122 and multiple memory dies (together comprising non-volatile storage system 100) implement a solid state drive (SSD), which can emulate, replace or be used instead of a hard disk drive inside a host, as a NAS device, etc. Additionally, the SSD need not be made to work as a hard drive.

Figure 4:
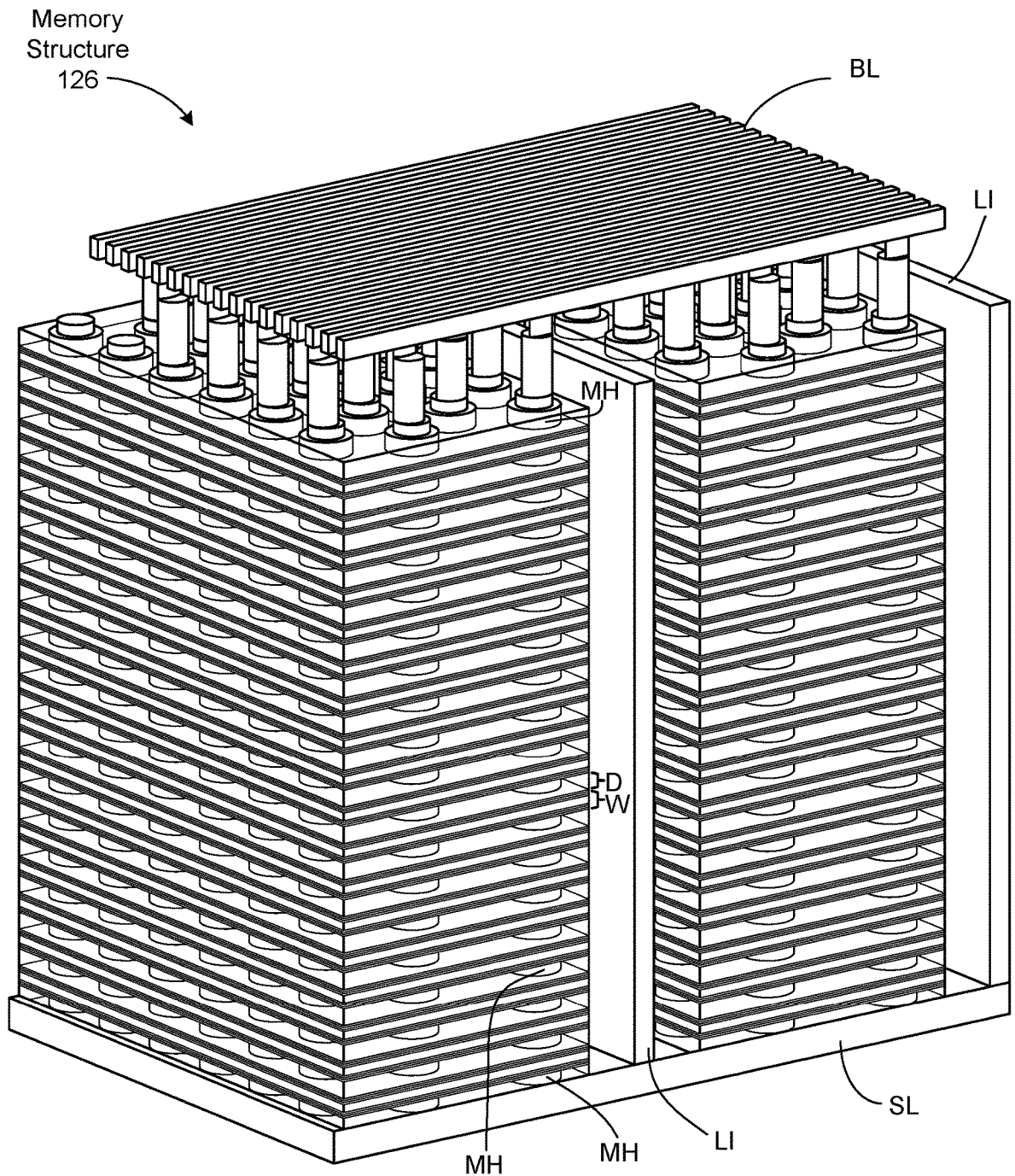
FIG. 4 is a perspective view of a portion of a three dimensional monolithic memory structure.

FIG. 4 is a perspective view of a portion of a three dimensional monolithic memory structure 126, which includes a plurality memory cells. For example, FIG. 4 shows a portion of one block of memory. The structure depicted includes a set of bit lines BL positioned above a stack of alternating dielectric layers and conductive layers. For example purposes, one of the dielectric layers is marked as D and one of the conductive layers (also called word line layers) is marked as W. The number of alternating dielectric layers and conductive layers can vary based on specific implementation requirements. One set of embodiments includes between 108-216 alternating dielectric layers and conductive layers, for example, 96 data word line layers, 8 select layers, 4 dummy word line layers and 108 dielectric layers. More or less than 108-216 layers can also be used. As will be explained below, the alternating dielectric layers and conductive layers are divided into four "fingers" by local interconnects LI. FIG. 4 only shows two fingers and two local interconnects LI. Below and the alternating dielectric layers and word line layers is a source line layer SL. Memory holes are formed in the stack of alternating dielectric layers and conductive layers. For example, one of the memory holes is marked as MH. Note that in FIG. 4, the dielectric layers are depicted as see-through so that the reader can see the memory holes positioned in the stack of alternating dielectric layers and conductive layers. In one embodiment, NAND strings are formed by filling the memory hole with materials including a charge-trapping layer to create a vertical column of memory cells. Each memory cell can store one or more bits of data. More details of the three dimensional monolithic memory structure 126 is provided below with respect to FIGS. 4A-4F.

Figure 4A:
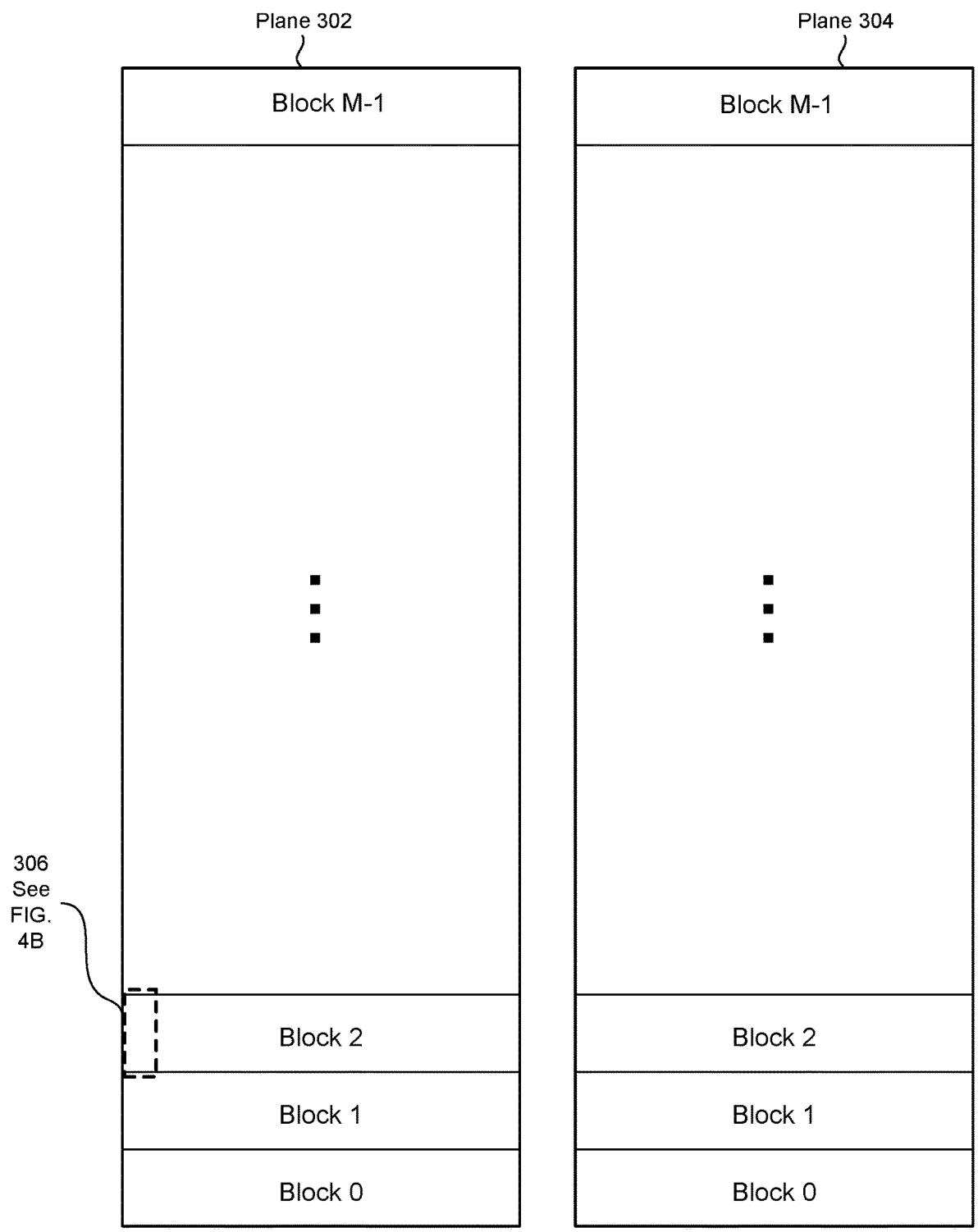
FIG. 4A is a block diagram of a memory structure having two planes.

FIG. 4A is a block diagram explaining one example organization of memory structure 126, which is divided into two planes 302 and 304. Each plane is then divided into M blocks. In one example, each plane has about 2000 blocks. However, different numbers of blocks and planes can also be used. In one embodiment, for two plane memory, the block IDs are usually such that even blocks belong to one plane and odd blocks belong to another plane; therefore, plane 302 includes block 0, 2, 4, 6, . . . and plane 304 includes blocks 1, 3, 5, 7, . . . . In on embodiment, a block of memory cells is a unit of erase. That is, all memory cells of a block are erased together. In other embodiments, memory cells can be grouped into blocks for other reasons, such as to organize the memory structure 126 to enable the signaling and selection circuits.

FIGS. 4B-4F depict an example 3D NAND structure. FIG. 4B is a block diagram depicting a top view of a portion of one block from memory structure 126. The portion of the block depicted in FIG. 4B corresponds to portion 306 in block 2 of FIG. 4A. As can be seen from FIG. 4B, the block depicted in FIG. 4B extends in the direction of 332. In one embodiment, the memory array will have 60 layers. Other embodiments have less than or more than 60 layers. However, FIG. 4B only shows the top layer.

FIG. 4B depicts a plurality of circles that represent the vertical columns. Each of the vertical columns include multiple select transistors and multiple memory cells. In one embodiment, each vertical column implements a NAND string. For example, FIG. 4B depicts vertical columns 422, 432, 442 and 452. Vertical column 422 implements NAND string 482. Vertical column 432 implements NAND string 484. Vertical column 442 implements NAND string 486.

Vertical column 452 implements NAND string 488. More details of the vertical columns are provided below. Since the block depicted in FIG. 4B extends in the direction of arrow 330 and in the direction of arrow 332, the block includes more vertical columns than depicted in FIG. 4B FIG. 4B also depicts a set of bit lines 415, including bit lines 411, 412, 413, 414, . . . 419. FIG. 4B shows twenty four bit lines because only a portion of the block is depicted. It is contemplated that more than twenty four bit lines connected to vertical columns of the block. Each of the circles representing vertical columns has an "x" to indicate its connection to one bit line. For example, bit line 414 is connected to vertical columns 422, 432, 442 and 452.

The block depicted in FIG. 4B includes a set of local interconnects 402, 404, 406, 408 and 410 that connect the various layers to a source line below the vertical columns. Local interconnects 402, 404, 406, 408 and 410 also serve to divide each layer of the block into four regions; for example, the top layer depicted in FIG. 4B is divided into regions 420, 430, 440 and 450, which are referred to as fingers. In the layers of the block that implement memory cells, the four regions are referred to as word line fingers that are separated by the local interconnects. In one embodiment, the word line fingers on a common level of a block connect together at the end of the block to form a single word line. In another embodiment, the word line fingers on the same level are not connected together. In one example implementation, a bit line only connects to one vertical column in each of regions 420, 430, 440 and 450. In that implementation, each block has sixteen rows of active columns and each bit line connects to four rows in each block. In one embodiment, all of four rows connected to a common bit line are connected to the same word line (via different word line fingers on the same level that are connected together); therefore, the system uses the source side select lines and the drain side select lines to choose one (or another subset) of the four to be subjected to a memory operation (program, verify, read, and/or erase).

Although FIG. 4B shows each region having four rows of vertical columns, four regions and sixteen rows of vertical columns in a block, those exact numbers are an example implementation. Other embodiments may include more or less regions per block, more or less rows of vertical columns per region and more or less rows of vertical columns per block.

FIG. 4B also shows the vertical columns being staggered. In other embodiments, different patterns of staggering can be used. In some embodiments, the vertical columns are not staggered.

Figure 4C:
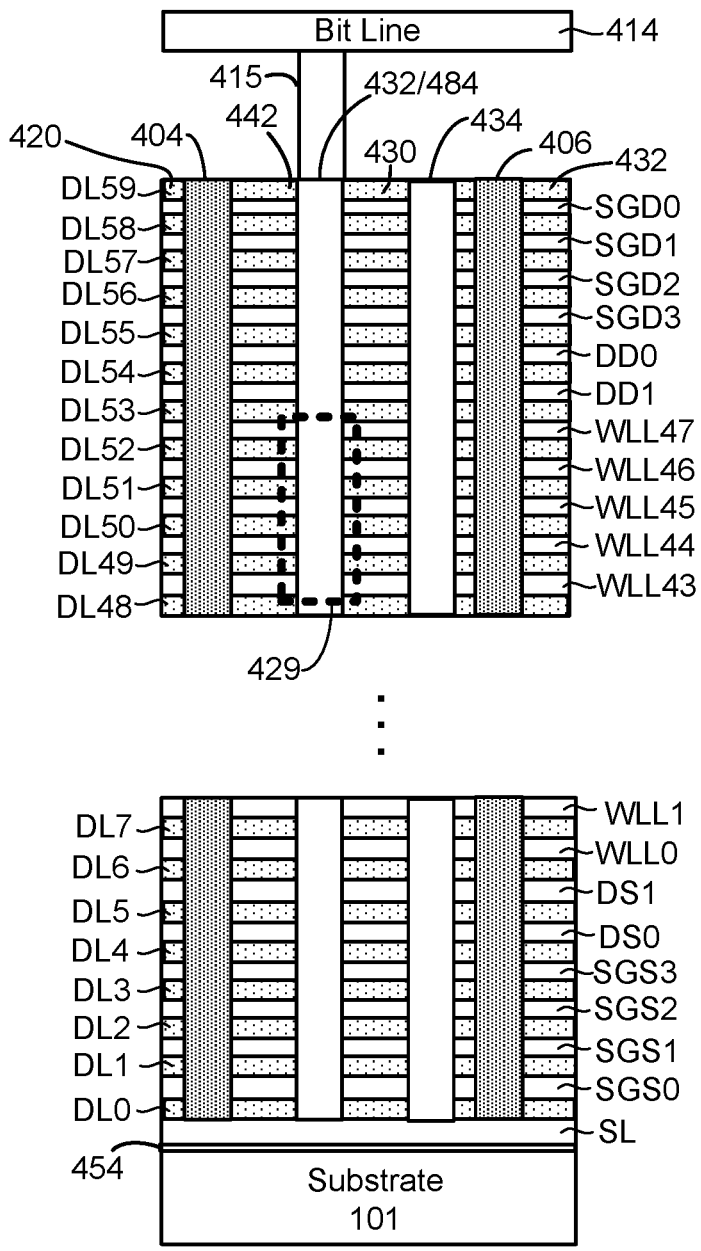
FIG. 4C depicts a cross sectional view of a portion of a block of memory cells.

FIG. 4C depicts a portion of an embodiment of three dimensional memory structure 126 showing a cross-sectional view along line AA of FIG. 4B. This cross sectional view cuts through vertical columns 432 and 434 and region 430 (see FIG. 4B). The structure of FIG. 4C includes four drain side select layers SGD0, SGD1, SGD2 and SGD3; four source side select layers SGS0, SGS1, SGS2 and SGS3; four dummy word line layers DD0, DD1, DS0 and DS1; and forty eight data word line layers WLL0-WLL47 for connecting to data memory cells. Other embodiments can implement more or less than four drain side select layers, more or less than four source side select layers, more or less than four dummy word line layers, and more or less than forty eight word line layers (e.g., 96 word line layers). Vertical columns 432 and 434 are depicted protruding through the drain side select layers, source side select layers, dummy word line layers and word line layers. In one embodiment, each vertical column comprises a NAND string. For example, vertical column 432 comprises NAND string 484. Below the vertical columns and the layers listed below is substrate 101, an insulating film 454 on the substrate, and source line SL. The NAND string of vertical column 432 has a source end at a bottom of the stack and a drain end at a top of the stack. As in agreement with FIG. 4B, FIG. 4C show vertical column 432 connected to Bit Line 414 via connector 415. Local interconnects 404 and 406 are also depicted.

For ease of reference, drain side select layers SGD0, SGD1, SGD2 and SGD3; source side select layers SGS0, SGS1, SGS2 and SGS3; dummy word line layers DD0, DD1, DS0 and DS1; and word line layers WLL0-WLL47 collectively are referred to as the conductive layers. In one embodiment, the conductive layers are made from a combination of TiN and Tungsten. In other embodiments, other materials can be used to form the conductive layers, such as doped polysilicon, metal such as Tungsten or metal silicide. In some embodiments, different conductive layers can be formed from different materials. Between conductive layers are dielectric layers DL0-DL59. For example, dielectric layers DL49 is above word line layer WLL43 and below word line layer WLL44. In one embodiment, the dielectric layers are made from $SiO_2$. In other embodiments, other dielectric materials can be used to form the dielectric layers.

The non-volatile memory cells are formed along vertical columns which extend through alternating conductive and dielectric layers in the stack. In one embodiment, the memory cells are arranged in NAND strings. The word line layer WLL0-WLL47 connect to memory cells (also called data memory cells). Dummy word line layers DD0, DD1, DS0 and DS1 connect to dummy memory cells. A dummy memory cell does not store user data, while a data memory cell is eligible to store user data. Drain side select layers SGD0, SGD1, SGD2 and SGD3 are used to electrically connect and disconnect NAND strings from bit lines. Source side select layers SGS0, SGS1, SGS2 and SGS3 are used to electrically connect and disconnect NAND strings from the source line SL.

FIG. 4D depicts a logical representation of the conductive layers (SGD0, SGD1, SGD2, SGD3, SGS0, SGS1, SGS2, SGS3, DD0, DD1, DS0, DS1, and WLL0-WLL47) for the block that is partially depicted in FIG. 4C. As mentioned above with respect to FIG. 4B, in one embodiment local interconnects 402, 404, 406, 408 and 410 break up each conductive layers into four regions or fingers. For example, word line layer WLL31 is divided into regions 460, 462, 464 and 466. For word line layers (WLL0-WLL31), the regions are referred to as word line fingers; for example, word line layer WLL46 is divided into word line fingers 460, 462, 464 and 466. In one embodiment, the four word line fingers on a same level are connected together. In another embodiment, each word line finger operates as a separate word line.

Drain side select gate layer SGD0 (the top layer) is also divided into regions 420, 430, 440 and 450, also known as fingers or select line fingers. In one embodiment, the four select line fingers on a same level are connected together. In another embodiment, each select line finger operates as a separate word line.

Figure 4E:
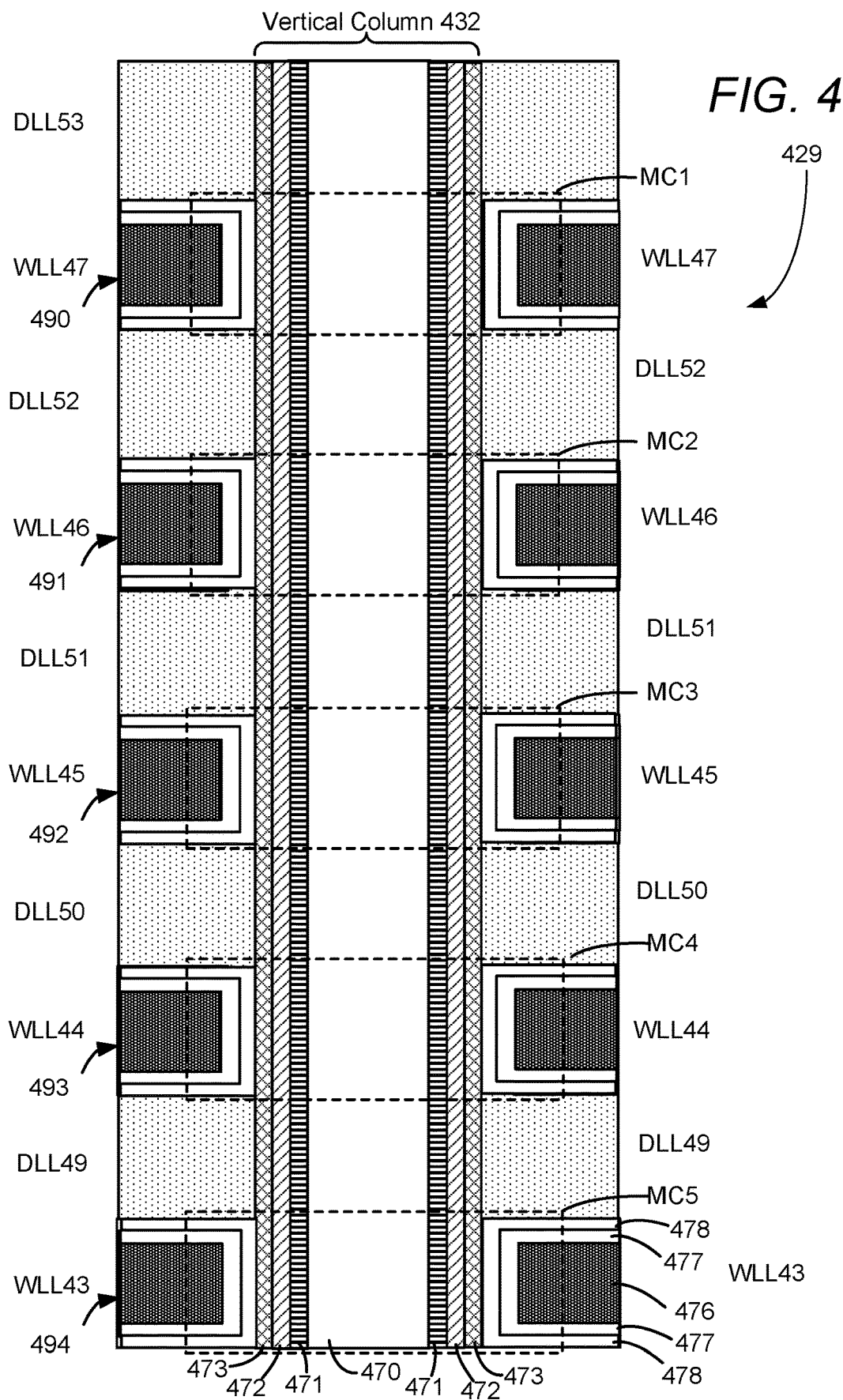
FIG. 4E is a cross sectional view of a vertical column of memory cells.

FIG. 4E depicts a cross sectional view of region 429 of FIG. 4C that includes a portion of vertical column 432. In one embodiment, the vertical columns are round and include four layers; however, in other embodiments more or less than four layers can be included and other shapes can be used. In one embodiment, vertical column 432 includes an inner core layer 470 that is made of a dielectric, such as $SiO_2$. Other materials can also be used. Surrounding inner core 470 is polysilicon channel 471. Materials other than polysilicon can also be used. Note that it is the channel 471 that connects to the bit line. Surrounding channel 471 is a tunneling dielectric 472. In one embodiment, tunneling dielectric 472 has an ONO structure. Surrounding tunneling dielectric 472 is charge trapping layer 473, such as (for example) Silicon Nitride. Other memory materials and structures can also be used. The technology described herein is not limited to any particular material or structure.

FIG. 4E depicts dielectric layers DLL49, DLL50, DLL51, DLL52 and DLL53, as well as word line layers WLL43, WLL44, WLL45, WLL46, and WLL47. Each of the word line layers includes a word line region 476 surrounded by an aluminum oxide layer 477, which is surrounded by a blocking oxide ($SiO_2$) layer 478. The physical interaction of the word line layers with the vertical column forms the memory cells. Thus, a memory cell, in one embodiment, comprises channel 471, tunneling dielectric 472, charge trapping layer 473, blocking oxide layer 478, aluminum oxide layer 477 and word line region 476. For example, word line layer WLL47 and a portion of vertical column 432 comprise a memory cell MC1. Word line layer WLL46 and a portion of vertical column 432 comprise a memory cell MC2. Word line layer WLL45 and a portion of vertical column 432 comprise a memory cell MC3. Word line layer WLL44 and a portion of vertical column 432 comprise a memory cell MC4. Word line layer WLL43 and a portion of vertical column 432 comprise a memory cell MC5. In other architectures, a memory cell may have a different structure; however, the memory cell would still be the storage unit.

When a memory cell is programmed, electrons are stored in a portion of the charge trapping layer 473 which is associated with the memory cell. These electrons are drawn into the charge trapping layer 473 from the channel 471, through the tunneling dielectric 472, in response to an appropriate voltage on word line region 476. The threshold voltage (Vth) of a memory cell is increased in proportion to the amount of stored charge. In one embodiment, the programming is achieved through Fowler-Nordheim tunneling of the electrons into the charge trapping layer. During an erase operation, the electrons return to the channel or holes are injected into the charge trapping layer to recombine with electrons. In one embodiment, erasing is achieved using hole injection into the charge trapping layer via a physical mechanism such as gate induced drain leakage (GIDL).

Figure 4F:
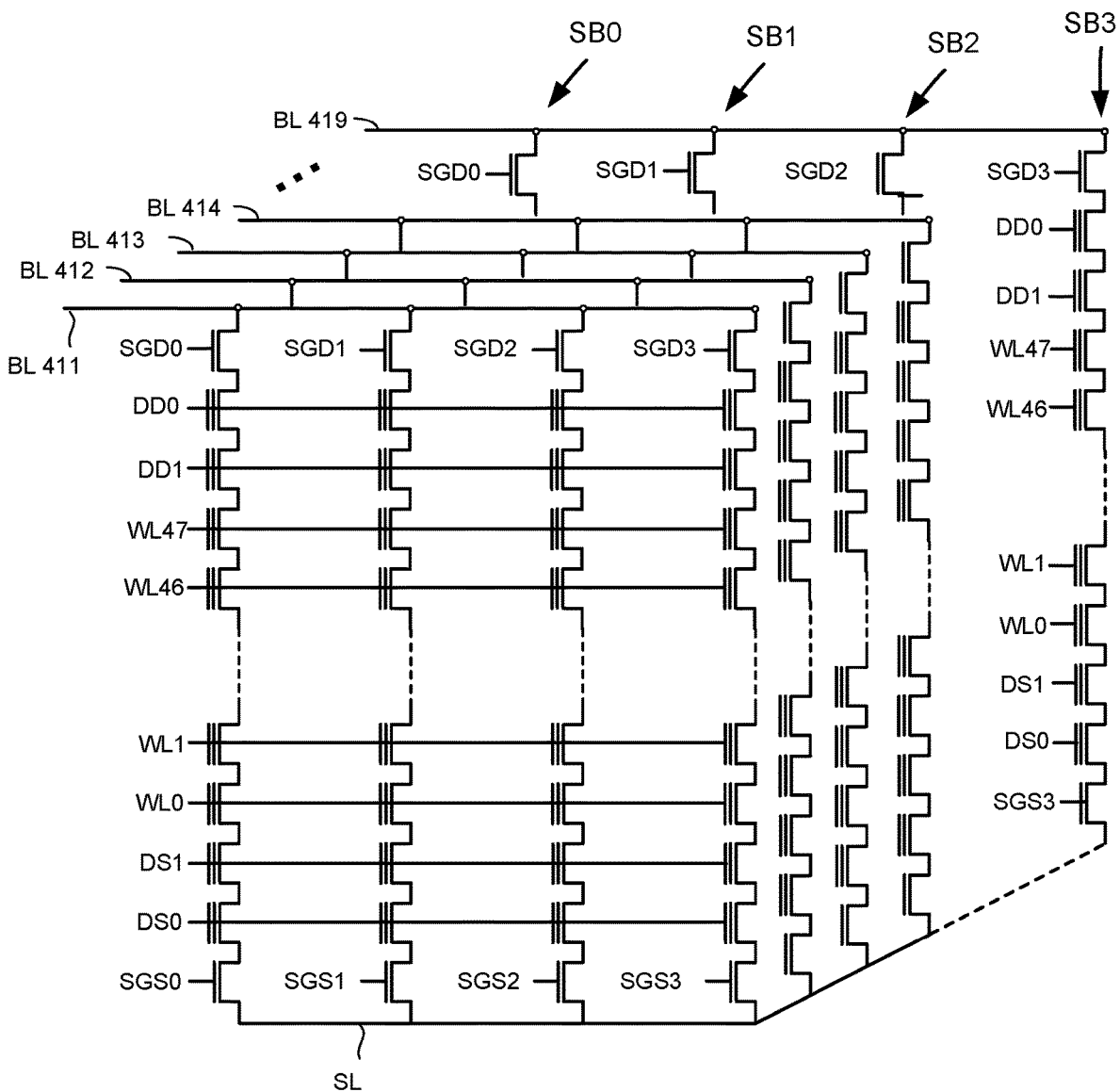
FIG. 4F is a schematic of a plurality of NAND strings.

FIG. 4F shows physical word lines WLL0-WLL47 running across the entire block. The structure of FIG. 4F corresponds to portion 306 in Block 2 of FIGS. 4A-F, including bit lines 411, 412, 413, 414, . . . 419. Within the block, each bit line connected to four NAND strings. Drain side select lines SGD0, SGD1, SGD2 and SGD3 are used to determine which of the four NAND strings connect to the associated bit line. The block can also be thought of as divided into four sub-blocks SB0, SB1, SB2 and SB3. Sub-block SB0 corresponds to those vertical NAND strings controlled by SGD0 and SGS0, sub-block SB1 corresponds to those vertical NAND strings controlled by SGD1 and SGS1, sub-block SB2 corresponds to those vertical NAND strings controlled by SGD2 and SGS2, and sub-block SB3 corresponds to those vertical NAND strings controlled by SGD3 and SGS3.

Although the example memory system of FIGS. 4-4F is a three dimensional memory structure that includes vertical NAND strings with charge-trapping material, other memory structures (in both a 2D and 3D configuration) can also be used with the technology described herein. For example, floating gate memories (e.g., NAND-type and NOR-type flash memory ReRAM memories, magnetoresistive memory (e.g., MRAM), and phase change memory (e.g., PCRAM) can also be used. The technology described herein can be implemented with any memory, or storage, device that requires periodic maintenance operations to increase its useful life and is impacted by temperature differences between when data is stored/written to the device and when data is retrieved/read from the device.

One example of a ReRAM memory includes reversible resistance-switching elements arranged in cross point arrays accessed by X lines and Y lines (e.g., word lines and bit lines). In another embodiment, the memory cells may include conductive bridge memory elements. A conductive bridge memory element may also be referred to as a programmable metallization cell. A conductive bridge memory element may be used as a state change element based on the physical relocation of ions within a solid electrolyte. In some cases, a conductive bridge memory element may include two solid metal electrodes, one relatively inert (e.g., tungsten) and the other electrochemically active (e.g., silver or copper), with a thin film of the solid electrolyte between the two electrodes. As temperature increases, the mobility of the ions also increases causing the programming threshold for the conductive bridge memory cell to decrease. Thus, the conductive bridge memory element may have a wide range of programming thresholds over temperature.

Magnetoresistive memory (MRAM) stores data by magnetic storage elements. The elements are formed from two ferromagnetic plates, each of which can hold a magnetization, separated by a thin insulating layer. One of the two plates is a permanent magnet set to a particular polarity; the other plate's magnetization can be changed to match that of an external field to store memory. This configuration is known as a spin valve and is the simplest structure for an MRAM bit. A memory device is built from a grid of such memory cells. In one embodiment for programming, each memory cell lies between a pair of write lines arranged at right angles to each other, parallel to the cell, one above and one below the cell. When current is passed through them, an induced magnetic field is created.

Phase change memory (PCRAM) exploits the unique behavior of chalcogenide glass. One embodiment uses a GeTe—Sb2Te3 super lattice to achieve non-thermal phase changes by simply changing the co-ordination state of the Germanium atoms with a laser pulse (or light pulse from another source). Therefore, the doses of programming are laser pulses. The memory cells can be inhibited by blocking the memory cells from receiving the light. Note that the use of "pulse" in this document does not require a square pulse, but includes a (continuous or non-continuous) vibration or burst of sound, current, voltage, light, or other wave.

Figure 5:
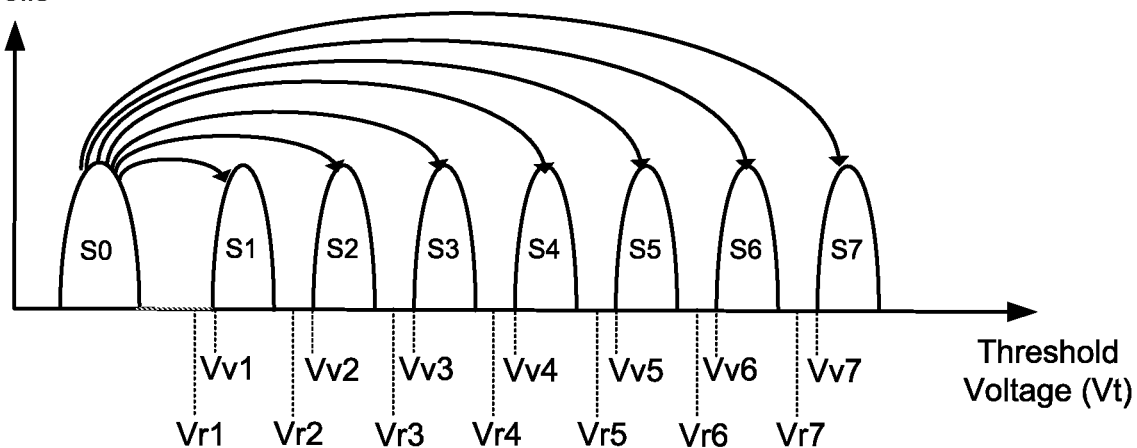
FIG. 5 depicts threshold voltage distributions and a process for programming non-volatile memory.

At the end of a successful programming process (with verification), the threshold voltages of the memory cells should be within one or more distributions of threshold voltages for programmed memory cells or within a distribution of threshold voltages for erased memory cells, as appropriate. FIG. 5 illustrates example threshold voltage distributions for the memory cell array when each memory cell stores three bits of data. Other embodiments, however, may use other data capacities per memory cell (e.g., such as one, two, four, or five bits of data per memory cell). FIG. 5 shows eight threshold voltage distributions, corresponding to eight data states. The first threshold voltage distribution (data state) S0 represents memory cells that are erased. The other seven threshold voltage distributions (data states) S1-S17 represent memory cells that are programmed and, therefore, are also called programmed states. Each threshold voltage distribution (data state) corresponds to predetermined values for the set of data bits. The specific relationship between the data programmed into the memory cell and the threshold voltage levels of the cell depends upon the data encoding scheme adopted for the cells. In one embodiment, data values are assigned to the threshold voltage ranges using a Gray code assignment so that if the threshold voltage of a memory erroneously shifts to its neighboring physical state, only one bit will be affected. Adjacent data states are data states that are next to each other with respect to threshold voltage (or other attribute used to determine data value). For example, data states S3 and S4 are adjacent data states, and data states S6 and S7 are adjacent data states.

FIG. 5 also shows seven read reference levels, Vr1, Vr2, Vr3, Vr4, Vr5, Vr6, and Vr7, for reading data from memory cells. In one embodiment, the read reference levels are read reference voltages. By testing whether the threshold voltage of a given memory cell is above or below the seven read reference voltages, the system can determine what data state (i.e., S0, S1, S2, S3, . . . ) the memory cell is in.

FIG. 5 also shows seven verify reference levels, Vv1, Vv2, Vv3, Vv4, Vv5, Vv6, and Vv7. In one embodiment, the verify reference levels are verify reference voltages. When programming memory cells to data state S1, the system will test whether those memory cells have a threshold voltage greater than or equal to Vv1. When programming memory cells to data state S2, the system will test whether the memory cells have threshold voltages greater than or equal to Vv2. When programming memory cells to data state S3, the system will determine whether memory cells have their threshold voltage greater than or equal to Vv3. When programming memory cells to data state S4, the system will test whether those memory cells have a threshold voltage greater than or equal to Vv4. When programming memory cells to data state S5, the system will test whether those memory cells have a threshold voltage greater than or equal to Vv4. When programming memory cells to data state S6, the system will test whether those memory cells have a threshold voltage greater than or equal to Vv6. When programming memory cells to data state S7, the system will test whether those memory cells have a threshold voltage greater than or equal to Vv7.

Figure 10:
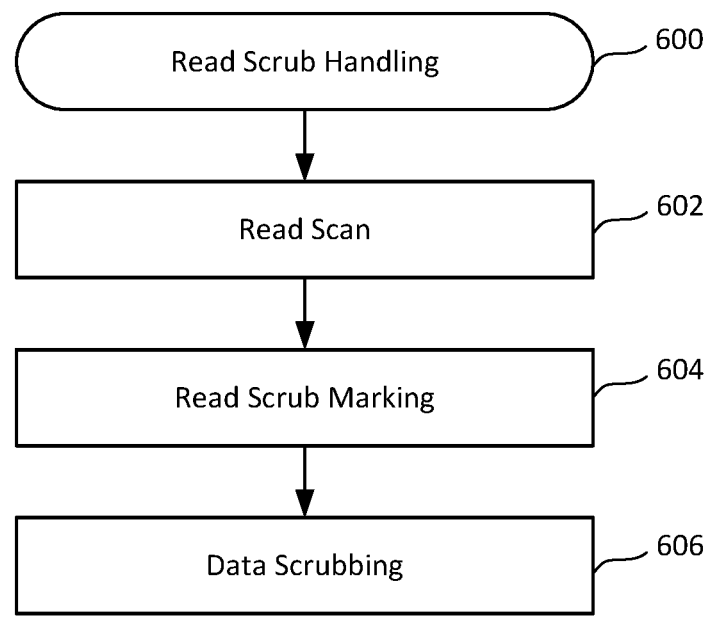
FIG. 10 is a flowchart describing a process of read scrub handling.

In some embodiments, the program voltage applied to the control gate includes a series of pulses that are increased in magnitude with each successive pulse by a predetermined step size (e.g. 0.2 v, 0.3 v, 0.4 v, or others). Between pulses, some memory systems will verify whether the individual memory cells have reached their respective target threshold voltage ranges. For example, FIG. 10 shows a portion of a signal applied to the control gates of a plurality of memory cells connected to a common word line.

Figure 6:
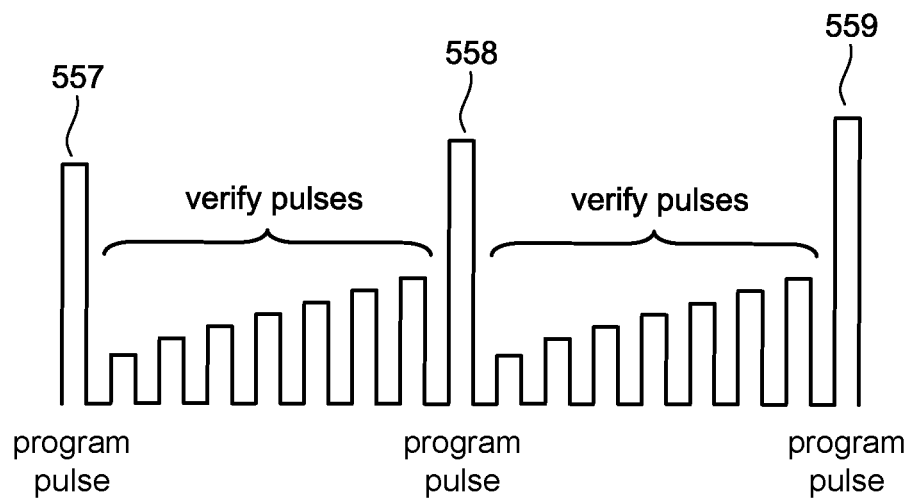
FIG. 6 depicts a plurality of programming pulses and a plurality of verify pulses.

FIG. 6 shows programming pulses 557, 558 and 559, with a set of verify pulses between the programming pulses. When performing full sequence programming in one embodiment, the verification process between programming pulses will test for each of the threshold voltage distribution (data states) S1-S7. Therefore, FIG. 6 shows seven verify pulses that have magnitudes corresponding to verify target levels Vv1, Vv2, Vv3, Vv4, Vv5, Vv6, and Vv7. In some embodiments, one or more of the verify operations can be skipped (and, therefore one or more of the verify pulses can be skipped) because the verify operation is not necessary or superfluous. For example, if none of the memory cells being programmed according to FIG. 0 have reached Vv2, there is no reason to verify at Vv7.

In one embodiment, known as full sequence programming, memory cells can be programmed from the erased data state S0 directly to any of the programmed data states S1-S7. For example, a population of memory cells to be programmed may first be erased so that all memory cells in the population are in erased data state S0. Then, a programming process is used to program memory cells directly into data states S1, S2, S3, S4, S5, S6, and/or S7. For example, while some memory cells are being programmed from data state S0 to data state S1, other memory cells are being programmed from data state S0 to data state S2 and/or from data state S0 to data state S3, and so on. The arrows of FIG. 5 represent the full sequence programming. The technology described herein can also be used with other types of programming in addition to full sequence programming (including, but not limited to, multiple stage/phase programming). In some embodiments, data states S1-S7 can overlap, with controller 122 relying on ECC to identify the correct data being stored.

FIG. 5 shows a programming process that includes one phase where all memory cells connected to the same word line are programmed concurrently during that one phase. In other examples, a multi-phase programming approach may be used.

Figure 7A:
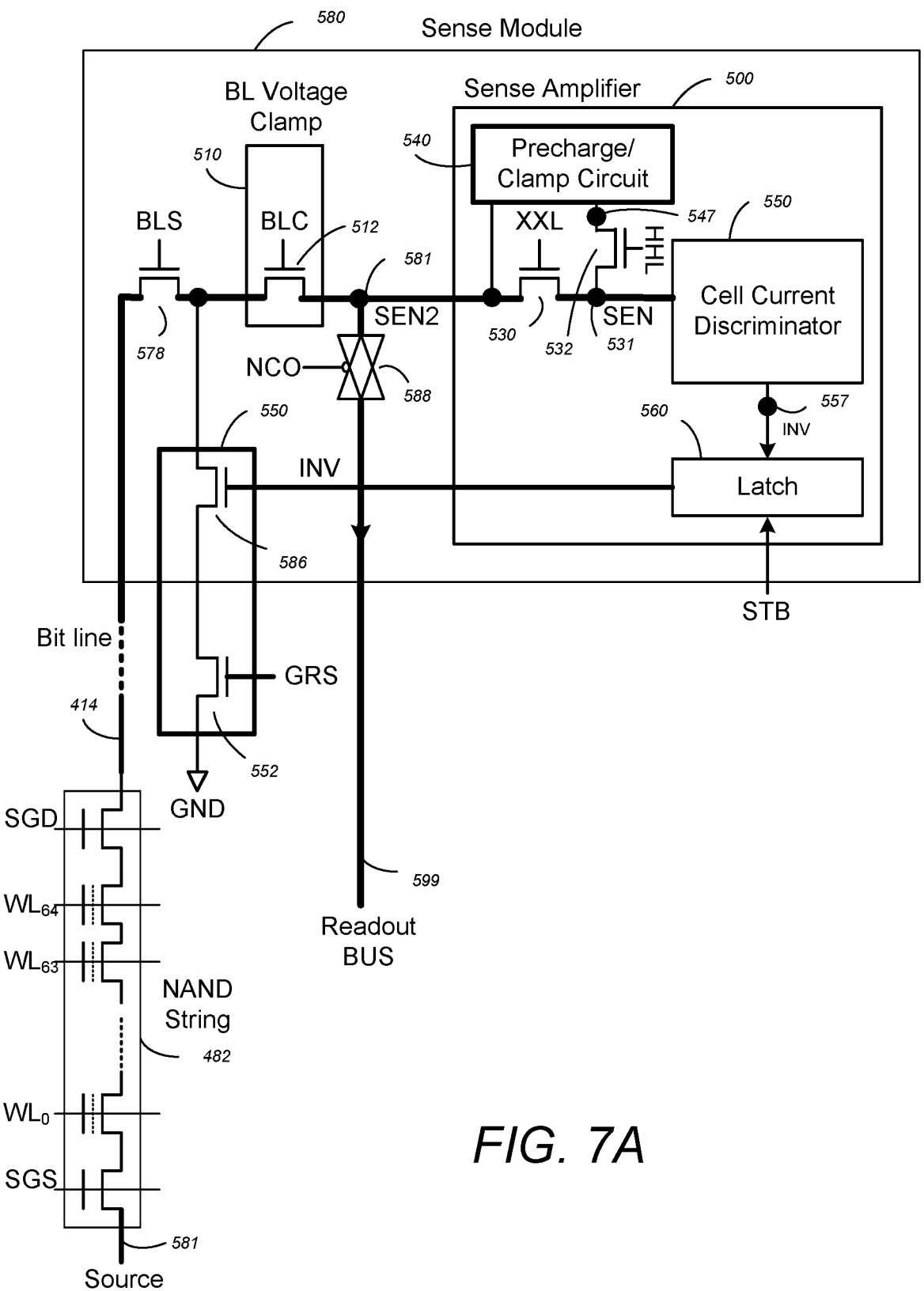
FIG. 7A depicts one embodiment of a sense module.

FIG. 7A depicts one embodiment of a sense module 580, which may form a part of a sense block 150 as shown in FIG. 1. As depicted, the sense module 580 may sense the conduction current of a memory cell in a NAND string 482 via a coupled bit line 414. Sense module 580 has a sense node 581 that can be selectively coupled to a bit line, a sense amplifier 500, and a readout bus 599. An isolation transistor 578, when enabled by a signal BLS, connects the bit line 414 to the sense node 581. The sense amplifier 500 senses the sense node 581. Sense amplifier 500 includes a pre-charge/clamp circuit 540, a cell current discriminator 550, and a latch 560. One embodiment of a pre-charge/clamp circuit 540 is described later in reference to FIG. 7B. One embodiment of a cell current discriminator 550 is described later in reference to FIG. 7C.

In one embodiment, sense module 580 controls the voltages and limiting currents applied to bit line 414 and senses the conduction current of a selected memory cell in the NAND string 482. The sense module 580 may include a pull-down circuit 550, which includes transistors 586 and 552, for selectively pulling the bit line 414 to ground. The pull-down circuit 550 is activated when both the signal INV and another signal GRS are both HIGH. The sense module 580 may include a bit line voltage clamp 510, which may clamp the bit line voltage during sensing. Bit line voltage clamp 510 may operate as a source-follower with transistor 512 in series with the bit line 414. BLC may be set to roughly a threshold voltage above the desired bit line voltage (e.g., 0.5V or 0.7V) during sensing. The source 581 of the NAND string 482 may be set to 0V or another bias voltage (e.g., 100 mV) during sensing of the conduction current of the selected memory cell.

Figure 7B:
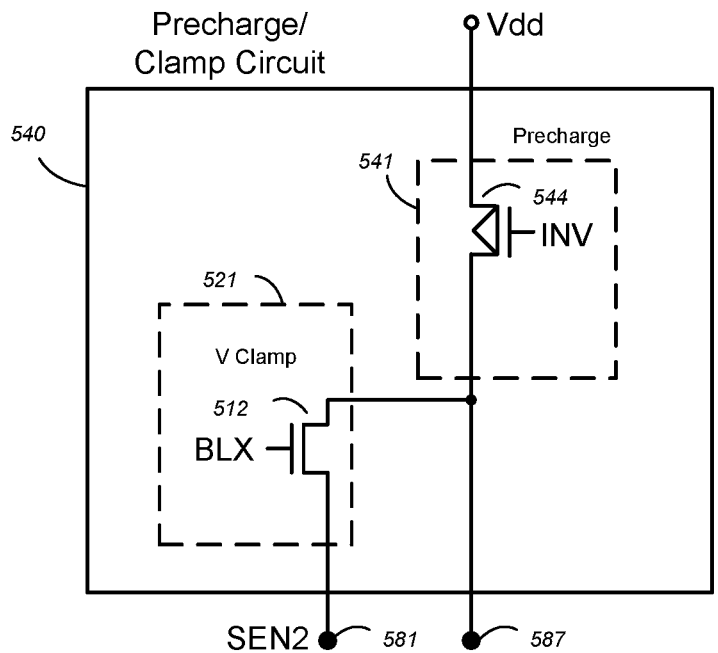
FIG. 7B depicts one embodiment of a pre-charge/clamp circuit.

FIG. 7B depicts one embodiment of a pre-charge/clamp circuit, such as pre-charge/clamp circuit 540 in FIG. 7A. The pre-charge/clamp circuit has a voltage clamp 521 component and a pre-charge circuit 541 component. The voltage clamp 521 is implemented by a transistor 512 controlled by an analog signal BLX at its gate. BLX is such that it ensures sufficient voltage on the node SEN2 581 (see FIG. 7A) so that the bit line voltage clamp 510 can function properly. The pre-charge circuit 541 is implemented by transistor 544 controlled by the signal INV at its gate.

Referring to FIG. 7A, when the selected gate voltage (e.g., a predetermined threshold voltage level) applied to a selected word line is stable, then the conduction current or the programmed threshold voltage of the selected memory cell can be sensed via the coupled bit line 414 via the transistor 530 gated by a signal XXL.

Figure 7C:
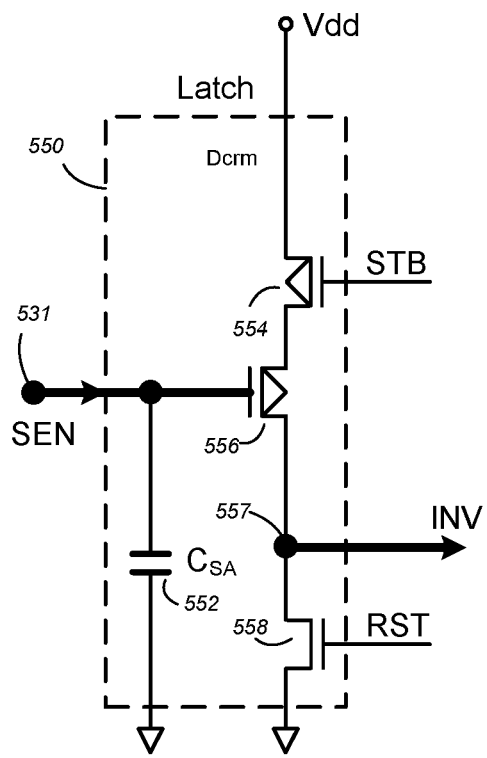
FIG. 7C depicts one embodiment of a cell current discriminator circuit.

FIG. 7C depicts one embodiment of a cell current discriminator circuit, such as cell current discriminator circuit 550 in FIG. 7A. The cell current discriminator 550 serves as a discriminator or comparator of current levels. It is coupled to the sense node to sense the conduction current in the memory cell. Cell current discriminator 550 includes a capacitor 552, p-channel transistor 556, transistors 554 and transistor 558. The cell current discriminator indirectly measures the conduction current of a memory cell by the rate it charges or discharges the capacitor 552. This is accomplished by sensing the signal SEN at the node 531. The signal SEN controls the gate of the p-transistor 556. Prior to sensing, SEN is pre-charged to VDD (HIGH) by the pre-charge circuit 541. Referring to FIG. 7A, the pre-charge is enabled by a signal HHL turning on the coupling transistor 532 so that the node SEN 531 is coupled to the pre-charge circuit 541 at node 547. Sensing is then accomplished by measuring the memory cell's conduction current by the rate it discharges the capacitor 552.

In one embodiment, during sensing, the conduction current of the selected memory cell will discharge the capacitor 552. The voltage of the node SEN will then decrease from VDD at a rate depending on the conduction current. After a predetermined discharging period (or sensing period), SEN will drop to some value that may or may not turn on the measuring p-transistor 556. If it drops sufficiently low to turn on the p-transistor 556, it will mean that the conduction current is higher than the reference current. This will also result in the INV signal being pulled HIGH when the signal STB is asserted. On the other hand, if the transistor 556 is not turned on at the end of the sensing period, the conduction current is lower than the reference current and the signal INV will be LOW. Referring to FIG. 7A, the end of the sensing period is marked by decoupling the bit line from the SEN node with XXL turning off the coupling transistor 530. The sensed result is then latched into the latch 560 based on a strobe signal STB. After the sensed result has been latched, signal NCO may be used to pass the state of the sense node 581 to the readout bus 599 via transfer gate 588.

In another embodiment, a cell current discriminator circuit may include a current mirror, which mirrors the current through the bit line, and a comparator which compares the mirrored current with a reference current. In some cases, a target reference current (or target cell current) may be injected into the bit line in order to facilitate current sensing. In some cases, the cell current discriminator circuit may include a differential amplifier for comparing the voltage associated with a sensed result with a reference voltage and determining the state of a memory cell based on the comparison.

Read disturb may occur on unselected word lines during read operations. During reading, one or more read pass voltages are typically applied to the unselected word lines of a selected block. The read pass voltage is a voltage sufficient to turn on a memory cell in the highest programmed state. When a high read pass voltage $V_{READ}$ is applied to the control gate of a memory cell (e.g, an erased memory cell), it may inadvertently soft or partially program the memory cell by injecting electrons into the memory cells, thereby raising their threshold voltage. Because the threshold voltage of the memory cells is raised, these cells are at a higher state level than anticipated before being programmed in response to the second programming request.

Figure 8:
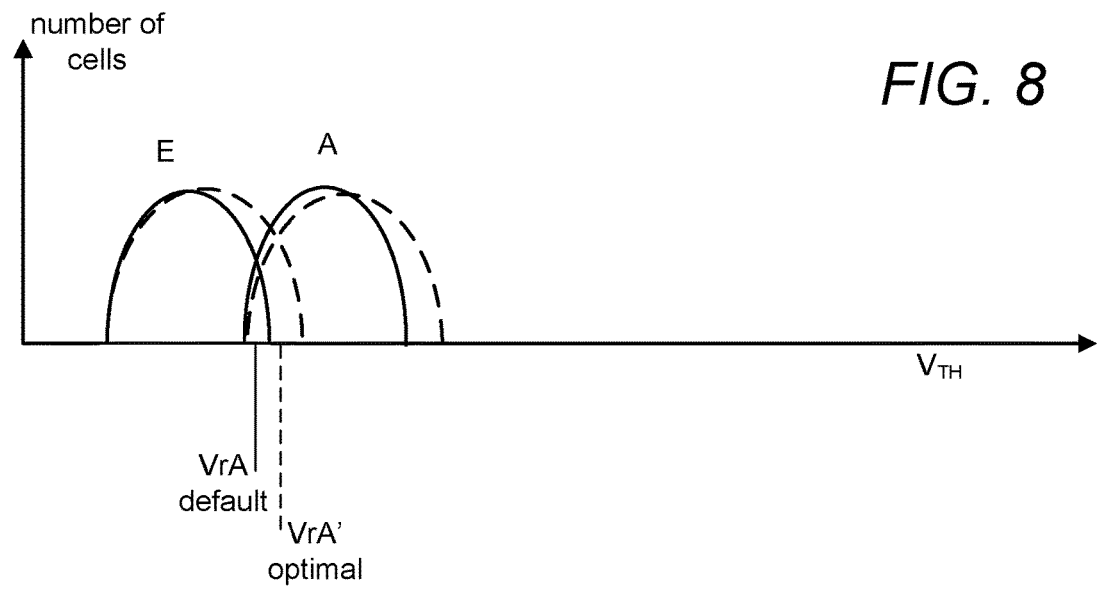
FIG. 8 depicts threshold voltage distributions illustrating read disturb effects.

FIG. 8 depicts an example of the effects of read disturbance. FIG. 8 depicts an example of threshold voltage distributions for a group of memory cells in states E and A after programming. FIG. 8 depicts the threshold voltage distributions before (solid lines) and after (dotted lines) read disturbance. FIG. 8 shows a default read reference level VrA that can be used to sense whether a memory cell is in state A. The default read reference level is provided at the middle point of the overlap in the state E and state A distributions. Without read disturb, the default read reference level should provide an accurate determination as to whether a memory cell's threshold voltage is above the reference level VrA. After read disturb, however, some memory cells in state E have their threshold voltage shifted in the positive direction toward state A. Some memory cells in state E have a threshold voltage above the default read reference level VrA. The read reference levels may be referred to as read levels for short.

The shift in threshold voltage may be enough to cause cells that are in the erased state to move into the state A or first programmed state distribution level. This read disturb effect may cause these cells to be read as in state A, rather than their intended erased state E. FIG. 8 shows that an optimal read reference level VrA' can be used to read the memory cells for state A after read disturb has occurred. In this example, the optimal read reference level VrA' is provided at the middle point of the overlap in the state E and state A distributions. While shown for state A, read disturb effects may widen and/or shift the threshold voltage distribution of memory cells programmed to other higher level states.

Figure 9:
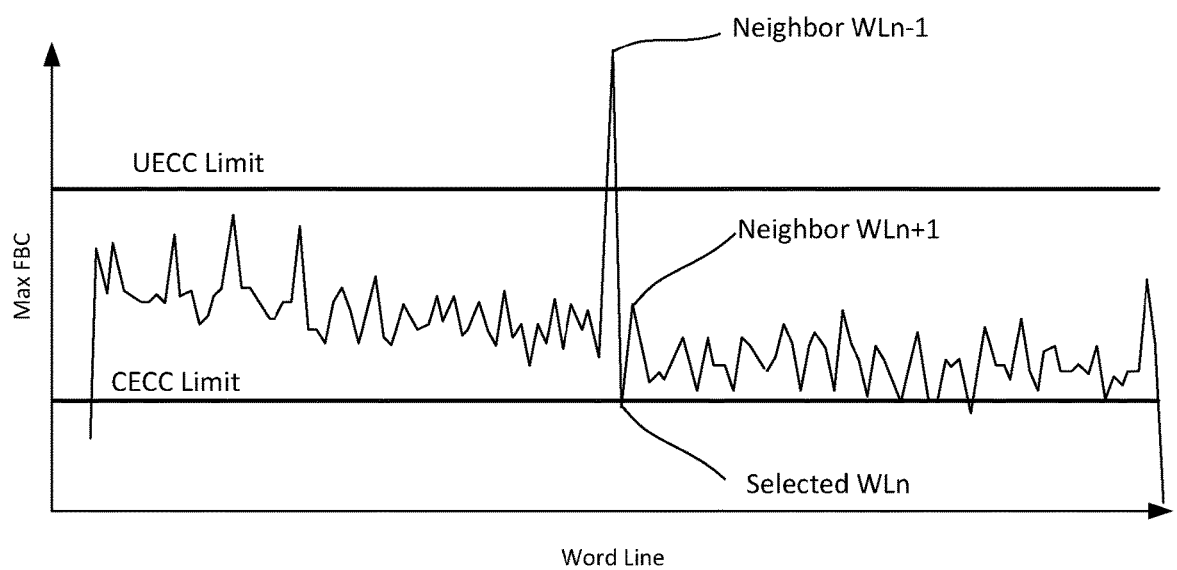
FIG. 9 is a chart depicting a cell fail bit count for a plurality of word lines.

FIG. 9 is a graph depicting the effects of read disturb on a group of a memory cells coupled a group of word lines. FIG. 9 depicts an maximum fail bit count (FBC) for the different word lines of a block of memory cells. The maximum fail bit count in this example is the largest fail bit count among the sectors that comprise a word line. The fail bit count is a determination of a bit error associated with a set of memory cells. More specifically, the fail bit count is the number of bits that have changed from a first setting (1 or 0) when stored to the opposite setting (0 or 1). The fail bit count, in certain embodiments, can be a number or rate of bits detected to be in error within a set of memory cells. In FIG. 9, the FBC is depicted for a sector of of memory cells (e.g., 2 KB) along the y-axis, and the word line numbers are depicted along the x-axis. A fail bit count is one example of an error that may be determined in association with reading a set of memory cells such as a page or other grouping of memory cells. A read error refers to reading one or more memory cells or bits of data incorrectly. For example, a memory cell intended for programming to a particular state may be read as in a different state. Similarly, a particular data bit intended to store one logic value, may be read as storing a different logic value. The fail bit count is a measure, estimate, or other determination of a number of bit errors that have been detected within data, such as that stored in a page. In one embodiment, an error correction code (ECC) or ECC information associated with the data may be used to determine the fail bit count or the number of bit errors that have occurred within the data. A bit error rate is another example of an error. A bit error rate is the number of bits over a fixed number of bits that are evaluated.

FIG. 9 depicts an CECC (correctable error) limit (e.g., 40 bits/2K) representing a maximum number of bits that should be in error for a given page before the block including the page is reprogrammed. FIG. 9 also depicts an UECC (uncorrectable error) limit (e.g., 77 bits/2K) representing a maximum number of bits that can be corrected by the system's error correction control (ECC) functionality. As FIG. 9 illustrates, a neighboring word line WLn−1 can be expected to cross the UECC limit if the FBC of a selected word line WLn crosses the CECC limit. The system uses the CECC limit (e.g., 40 bits/2K) as a threshold to determine whether a block of memory cells should be reprogrammed. For example, if a page is read and is determined to have a FBC above the CECC limit, the system can reprogram data for the page. The system typically reprograms data for the entire block including the affected page.

A maintenance operation may include refreshing data in a current memory location by additional verification and programming as needed. A maintenance operation may also include a reprogramming process where data is read from a memory location and then programmed again in the same or a different memory location. The process of correcting data by reading data from a first memory location and reprogramming it to another location on the memory may be referred to as a read scrub. FIG. 10 is a flowchart describing a traditional read scrub process 600. Process 600 can be performed by control circuitry 110 and/or controller 122. During reprogramming, data that is already written to the memory is read back, and written again in the same or a different memory location.

There are three primary phases of read scrub operations, a scan phase 602, marking phase 604, and corrective phase 606. The scan phase 602 includes reading one or more pages of a selected block to determine whether the block should be reprogrammed (i.e., scrubbed). A read scan may be performed as part of a host operation, or may be performed specifically to determine whether to reprogram data. User data may or may not be gathered from the read data. The primary objective of the read scan is not to gather user data, but instead, to obtain a data integrity check result. As such, the read scan may determine an error associated with one or more pages without determining the values for user data stored in those pages. Subsequent action on the part of the system is guided by the result of the integrity check, and not particularly by the data itself. The system may subsequently require the use of some information from the data read, such as overhead data, if the data fails the integrity check and corrective action is required. A read scan is one example of a test process for one embodiment. A read scan is a read to determine one or more errors associated with memory cells. Although a read scan is shown as part of read scrub handling in FIG. 10, a read scan may be performed anytime, independently or as part of another memory operation. Testing to determine whether to subject memory to a maintenance operation includes a read scan in one embodiment.

A read scan 602 can be performed as part of a host read, as a targeted word line (WL) scan (e.g., WLn+1, WLn−1, end word line), as an automatic read scan, a manual read scan, or when closing an open block. In one example, the selection of the particular areas to read is generally guided by the location and number of read, write and erase operations performed in the normal course of system operation in the context of the physical characteristics of the memory device. Generally, the read scan will be performed on areas of the memory array that have been exposed to voltages, currents or cross talk as a result of operations in other areas. Alternatively, the read scan locations may be decoupled from other memory operations, and made to follow a deterministic or random sequence.

A read scan 602 can be performed at various times. In general, a scan operation can be initiated in response to any number of factors, such as a number of host operations, a number of physical read, write and/or erase operations, a time period, usage characteristics of the host, or some random or pseudo-random sequence, the generating an checking of which may be tied to any of the above.

The marking phase 604 typically involves marking or designating a group of memory cells such as a block for reprogramming due to a high FBC associated with the group. A read scrub queue, also referred to as a reprogram queue, may be used to identify the groups of memory cells to be reprogrammed. The read scrub queue may be a data structure that stores identifiers of groups of memory cells to be reprogrammed, or may be a flag or other identifier stored with or apart from the group to mark that the group should be reprogrammed. In one example, the system performs a read scan by reading one or more selected pages from a block. If the FBC for a page is above a threshold (e.g., CECC limit), the read scrub queue is updated to identify the corresponding block for reprogramming.

The data scrub phase 606 includes reading the data from a group of memory cells identified in the read scrub queue, and rewriting the read data in the same or a different location in the memory. Such scrub writes may be deferred in order to optimize system performance, or to meet specific real-time needs. Multiple read operations and program operations may be used to read and reprogram all of the data from a block. Corrective action in the data scrub phase can additionally include rotation of the data during a scrub write operation; that is, the memory cell states representing specific stored data is changed from what it was. Corrective action can also include mapping cells, columns or other structures deemed to be susceptible to disturb out of the system.

Data scrub operations are often implemented with a conservative approach so that data on the verge of exceeding the system's error correction capability limit due to read disturb is identified and the content of the block reprogrammed. While such approaches may be effective at maintaining data integrity, they may also result in unnecessary scrubbing. This may have negative effects on memory performance by requiring unnecessary read and program operations. A higher degradation in system performance may result as memory and circuitry times are dedicated to these operations. Additionally, read scrub operations may reduce the life expectancy of the memory. Each read and program operation in the memory may result in degradations in the memory. Unnecessarily scrubbing can lead to earlier end of life conditions.

The disclosed technology provides techniques for reducing maintenance operations such as reprogramming in non-volatile memory. The disclosed technology recognizes that memory may be affected by other causes that resemble read-disturb. For example, many blocks may be placed into a read scrub queue at the beginning of life due to non-read disturb effects, resulting in unnecessary scrubbing. These causes may result in typical memory systems mistakenly determining that memory should be scrubbed due to read disturb issues. The disclosed technology provides techniques for discriminating read disturb from these other causes so that memory is more accurately subjected to maintenance operations in response to read disturb affects.

Memory may also be affected by differences in temperature between the time the memory is programmed, and the time the memory is read. The effects of these differences may be referred to as cross-temperature threshold voltage (Vt) distribution widening, or more simply cross-temperature effects. In some cases, cross-temperature threshold voltage (Vt) distribution widening may present a memory cell reliability concern as the widening of threshold voltage distributions may lead to overlaps in programming states and/or to increased data read errors. In one example, when memory cells are programmed at a first temperature (e.g., a hot temperature, such as 85 degrees Celsius) and then read at a second temperature (e.g., a cold temperature, such as negative 25 degrees Celsius), then the data stored in the memory cells may not be read back correctly due to the widening of the threshold voltage distributions. For example, if a memory cell is read at a lower temperature than the temperature at which it was programmed, it may appear to have a threshold voltage that has shifted in the positive direction.

These cross-temperature effects have a similar signature to read disturb effects. For example, read disturb and cross-temperature effects generally cause the apparent threshold voltage of memory cells to shift in the positive direction.

The disclosed technology provides a process for distinguishing between cross-temperature effects and read disturb effects as part of determining whether to perform a maintenance operation such as a read scrub for a memory. A process is provided that compensates for cross-temperature effects while testing to determine whether to perform a read scrub. A temperature compensation is applied that attempts to remove the cross-temperature effects so that testing more accurately detects whether read disturb has occurred, without the effects of temperature. By removing the cross-temperature effects, maintenance operations can be more accurately scheduled for memory that has experienced read disturb, as opposed to cross-temperature effects.

As used herein, a temperature compensation comprises any adjustment to a testing, sensing, or reading parameter that is configured to mitigate or remove the effects of a cross-temperature effect. Examples of parameters that may be adjusted to compensate for a temperature effect include sensing voltage threshold, read threshold, wordline voltage, bitline voltage, current magnitude, resistance level, or the like. Applying a temperature compensation comprises using an adjusted parameter in association with a sense operation. The temperature compensation can be applied to any portion of a memory array including selected memory cells, unselected memory cells, and/or control lines, and/or to circuits that perform memory operations for memory cells of the array. The temperature compensation attempts to compensate for a change in a memory cell that may occur due to a temperature change. The temperature change may be a change in temperature between the time a memory cell is programmed, and the time a memory cell is read.

Figure 11A:
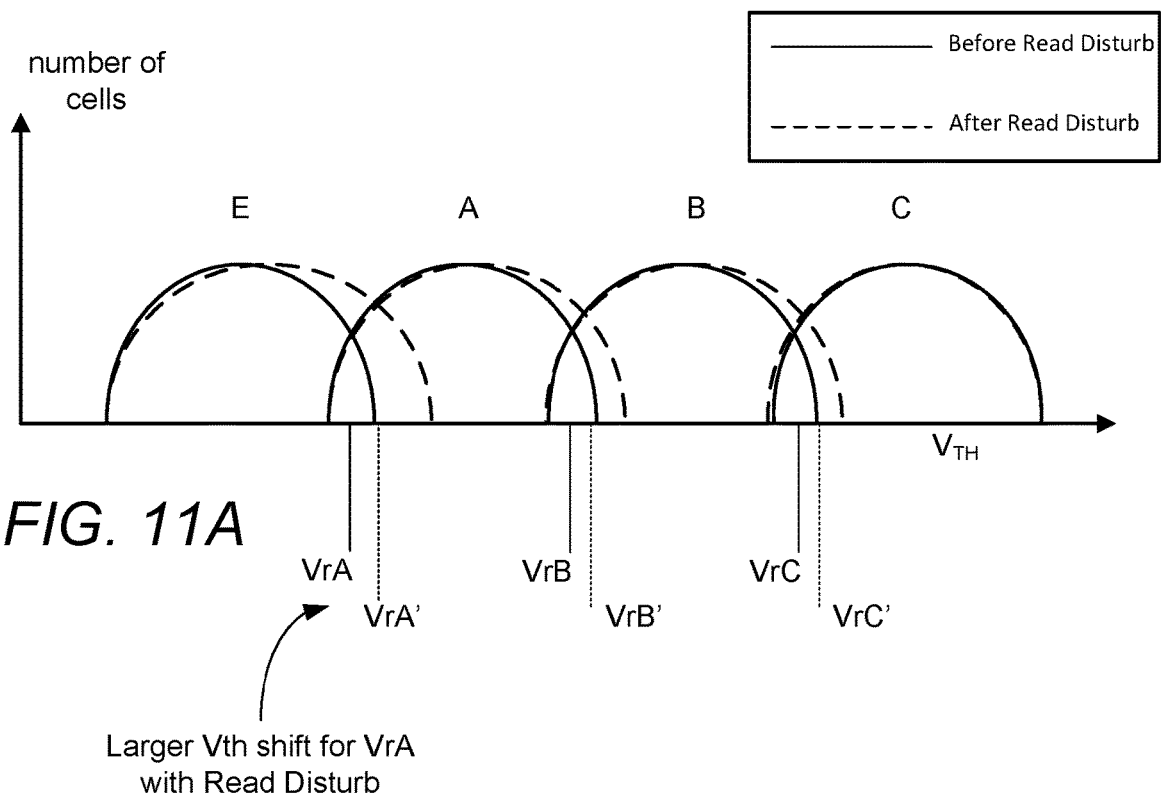
FIG. 11A depicts threshold voltage distributions for a group of memory cells before and after read disturb effects.

FIG. 11A depicts threshold voltage distribution for a group of memory cells programmed to states E, A, B, or C. FIG. 11A illustrates the effects of read disturb on the threshold voltage distributions. Read disturb results from weak programming on an unselected word line due to a read pass voltage applied during reading. This causes the threshold voltage of the memory cells to shift in the positive direction. As shown in FIG. 11A, the threshold voltage of each voltage distribution has increased in the positive direction. This causes the optimal read levels for each state to shift toward the right from the default read levels VrA, VrB, and VrC. Optimal read levels VrA', VrB', and VrC' are shown.

Figure 11B:
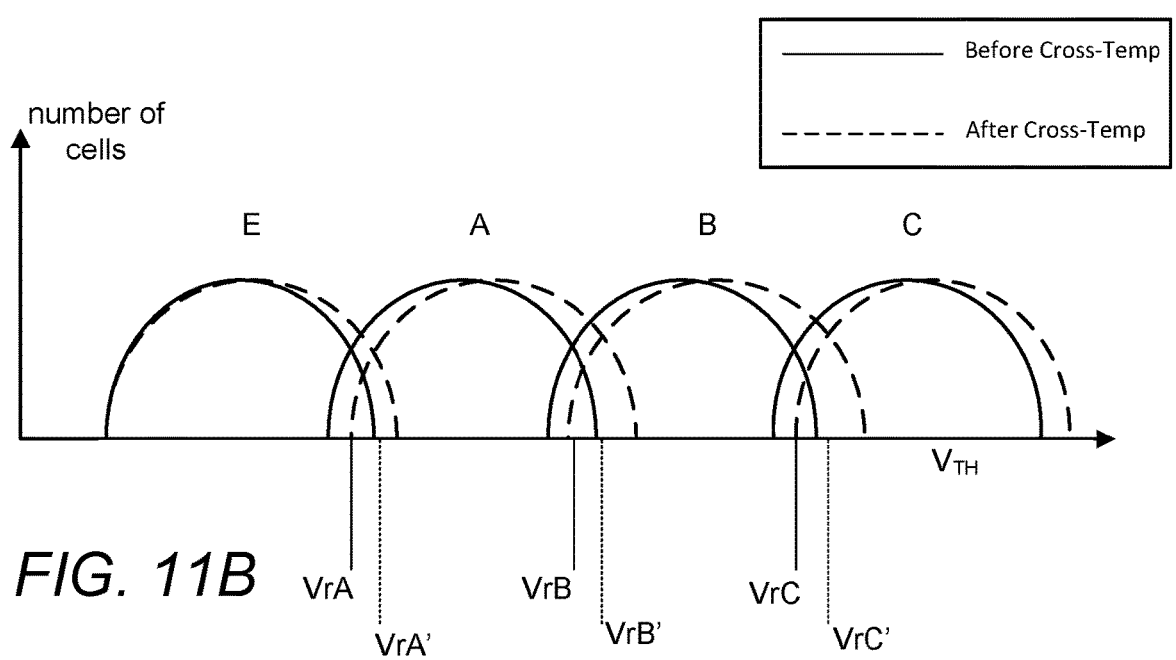
FIG. 11B depicts threshold voltage distributions for a group of memory cells before and after cross-temperature effects.

FIG. 11B depicts the threshold voltage distributions for the group of memory cells programmed to states E, A, B, or C. FIG. 11B illustrates the effects of differences in program and read temperatures. The cross-temperature effect of programming at a higher temperature and reading at a lower temperature is shown. The cross-temperature effect causes the apparent threshold voltage of the memory cells to shift in the positive direction. As shown in FIG. 11B, the apparent threshold voltage of each voltage distribution increases in the positive direction. As with FIG. 11A, this causes the optimal read levels VrA', VrB', and VrC' for each state to shift toward the right from the default level.

While FIGS. 11A and 11B illustrate that the read disturb and cross-temperature effects are similar, differences exist. In the case of read disturb as shown in FIG. 11A, the distance of the optimal read level from the default read level for state A is more when compared to the levels for state B and state C. By contrast, the distance of the optimal read levels from the default read levels are about the same for the cross-temperature effects. Additionally, the distance or shift from the default level CR3 for state C is more for the cross-temperature effects than for the read disturb effects. Similarly, the shift from the default level for state A is more for the read disturb effects than for the cross-temperature effects.

FIG. 11B show threshold voltage increases due to cross-temperature effects. These effects may cause the threshold voltage of floating gate to change as shown. Similar effects are experienced by other types of memories. The cross-temperature effects will cause the threshold voltage of charge trap memories to vary in the same manner with temperature. As such, when reading at a low temperature relative to a programmed temperature of memory cells, the threshold voltage of floating gate and charge trap type memories may increase. Reading at a high temperature relative to a programmed temperature may cause the threshold voltage of these memories to decrease.

Cross-temperature effects will cause the operational voltage and/or resistance of resistive and phase change memories to vary in the same manner with temperature. As such, when reading at a low temperature relative to a programmed temperature of memory cells, the resistance of phase change and resistive memories may increase. Reading at a high temperature relative to a programmed temperature may cause the resistance of these memories to decrease.

According to one embodiment of the disclosed technology, a set of adjusted read levels is provided for sensing to compensate for cross-temperature effects without compensating for read disturb effects. In one example, the set of adjusted read levels includes a shifted read level for states B and C, but not for state A. Because the read disturb effects are more pronounced for state A than the cross-temperature effects, not compensating for the state A level may result in the read disturb effects remaining. Similarly, shifting the read reference levels in the positive direction for states B and C helps in correcting cross-temperature effects, without correcting read disturb effects to a significant degree.

Figures 12A, 12B:
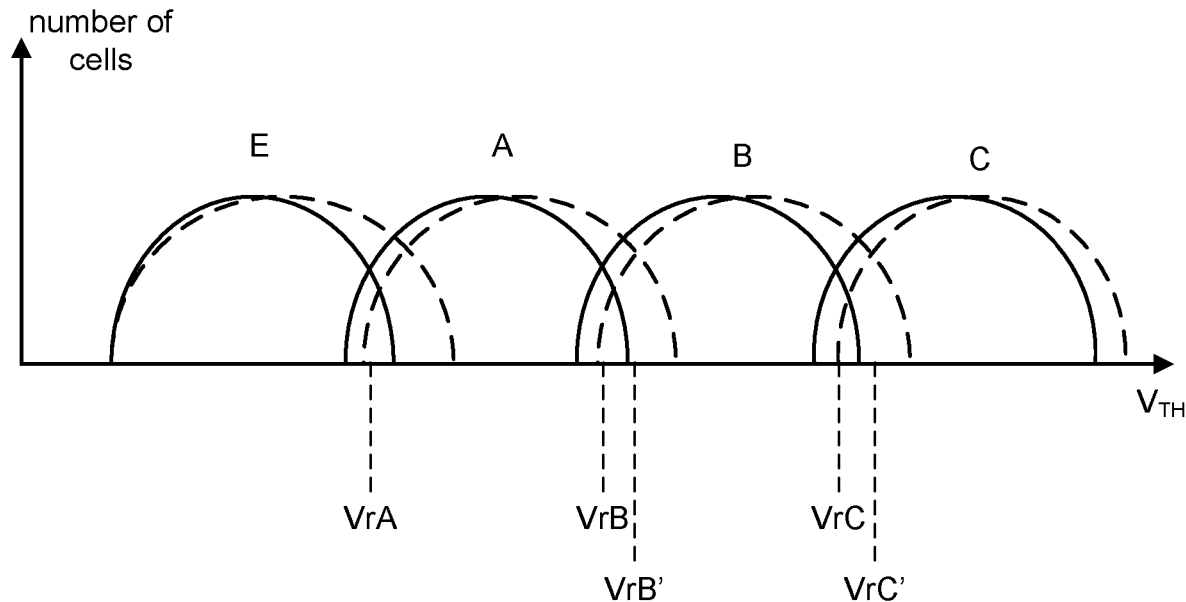
FIG. 12A depicts threshold voltage distributions and a set of adjusted read levels in accordance with one embodiment.
FIG. 12B is a table depicting a set of adjusted read levels in accordance with one embodiment.

FIG. 12A is a chart showing threshold voltage distributions for a group of memory cells, and a set of adjusted read levels. A set of default read reference levels VrA, VrB, and VrC are shown. The memory can discriminate whether the threshold voltage of a particular memory cell is above or below each of the read levels. In one example, read voltages at the read levels can be applied to a selected word line during sensing.

FIG. 12A also shows a set of adjusted read reference levels in accordance with one embodiment. In this example, the set of adjusted read levels includes the default read level for state A, and adjusted read levels for states B and C. The adjusted read levels are shifted in the positive direction to more accurately sense memory cells in states B and C if cross-temperature effects are present. In this example, an adjusted read level is not used for state A. As earlier described, the state A distribution under cross-temperature effects does not shift as much as it does under read disturb effects. Accordingly, reading without a state A distribution while reading with state B and C compensations will compensate for cross-temperature effects but not read disturb effects.

In another example, the adjusted read levels can be shifted in the negative direction to more accurately sense when a temperature associated with reading the memory cells is higher than a temperature associated with an earlier programming of the memory cells.

FIG. 12B is a table showing a specific example of default and adjusted read reference levels. In this example, the default read levels are VrA, VrB, and VrC. The compensated read levels are Vra, Vrb+100 mv, and Vrc+100 mv. The read levels, also referred to as reference levels, for states B and C are both shifted in the positive direction by 100 mv. It is noted that the shifts provided in FIG. 12B are by way of example only. Other amounts of adjustment may be appropriate according to the needs or parameters of a particular implementation. Further, while FIG. 12B shows an example with four states, the disclosed technology may be applied when sensing for any number of states, for example 6, 8, 10, 12, or more. In various examples, a set of adjusted read levels can be selected that compensate for cross-temperature effects without compensating or providing as much compensation for read disturb effects.

FIGS. 12A-12B show threshold voltage reference levels. Similar resistance reference levels may be used in phase change and resistive memories. For example, the resistance of memory cells may increase in a similar fashion to increases in threshold voltage. Accordingly, one embodiment provides compensated resistance reference levels. These levels may be increased when reading a lower temperature than a programmed temperature of the memory cells, and may be decreased when reading at a higher temperature than a programmed temperature of the memory cells.

Sensing at the compensated read levels may be performed in various ways. For example, a compensated read voltage equal to the compensated read level can be applied to the selected word line for sensing at the adjusted level. In other examples, the default read voltages can be applied to the selected word line while adjusting other read parameters to provide compensation for sensing at the adjusted level. For example, a bit line voltage can be increased while applying a default read voltage to shift the level at which sensing is performed in the positive direction from the default read voltage. Additionally, a sense time can be increased to increase the read level while providing the same read voltage to the selected word line.

Cross-temperature dependent sensing can be performed by setting or adjusting one or more sense parameters to accomplish sensing at a compensated reference level. A reference level is a comparison point for detecting a level of data programming of a memory cell. A reference level may be a read reference level, threshold voltage level, or verify reference level as shown in FIG. 5. The reference level may be a reference voltage to which the threshold voltage of a memory cell is compared. In one embodiment, the reference level may be a reference resistance to which the resistance of a memory cell is compared. In one embodiment, the reference level may be a reference current to which the current of a memory cell is compared. One or more sense parameters may be used to sense at a particular reference level. A read or verify voltage is typically applied to a selected memory cell at a read or verify level. Pass voltages, bit line voltages, source line voltages, etc. are also applied when sensing at the reference level. Additionally, particular sense times, integration capacitance charge or discharge amounts, etc. are used when sensing at the reference level. These sense parameters that are used during sensing can be adjusted to accomplish sensing at a compensated reference level. One or more of the sense parameters can be adjusted to accomplish sensing at a compensated reference level. For example, the read voltage applied to the selected word line may be adjusted. Similarly, the sensing time, the amount of integration capacitance charged or discharged during the sensing time, the selected bit line voltage applied to a selected bit line during the read operation may be set and/or adjusted. One or a combination of sense parameters can be used to sense at a compensated reference level.

Figure 13:
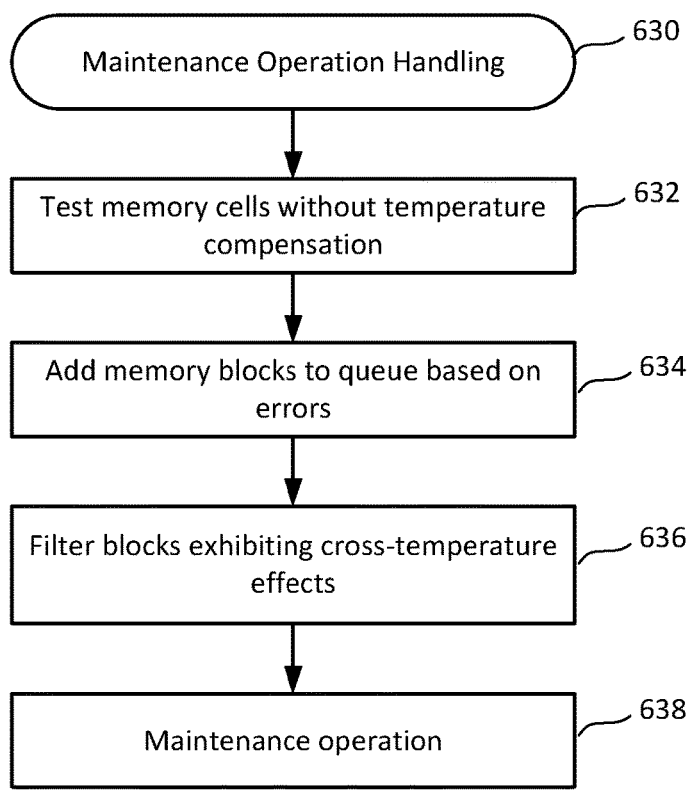
FIG. 13 is a flowchart describing a process of read scrub handling in accordance with one embodiment.

FIG. 13 is a flowchart describing a process 630 of maintenance operation handling according to one embodiment of the disclosed technology. In one embodiment, process 630 is performed by control circuit 110, controller 122, and/or control circuit 950. Process 630 is one example of using compensated read levels to determine whether a group of memory cells should be subjected to a maintenance operation. FIG. 13 depicts a process for determining whether to perform a maintenance operation. The maintenance operation may include a data scrub operation or a data refresh operation in one example, but the disclosed process can be used to determine whether to perform other maintenance operations. In one embodiment, process 630 is performed to determine whether to reprogram memory cells.

At step 632, the system tests a set of memory cells, such as a set of memory cells storing one or more pages of a selected block. In one embodiment, testing includes sensing, reading, or verifying the set of memory cells. The system does not use temperature compensation when testing the set at step 632. In one embodiment, the system uses a default set of sense parameters as part of reading or verifying. For example, the system can use a default set of read levels when reading the selected pages. The default set of read levels is used to detect the state to which each cell of a word line is programmed. Step 632 is one example of a read scan as described in step 602 of process 600.

The default set of read levels is used to detect whether a memory cell is programmed to one of a plurality of states. The system may determine whether the memory cell has a threshold voltage above or below each of the read levels. The system may use a default set of read values when sensing at the default set of read levels. The system may use a default set of values (voltage or current) applied to the selected word line, the unselected word lines, bit lines, source lines, etc. during sensing. The set of read values may also include a sense time that a sense amplifier uses in detecting the threshold voltage.

At step 632, the system determines an error associated with testing the memory cells. In one embodiment, the system determines a read error associated with each page that is read at step 632. For example, the system may determine a number of memory cells or bits from the page that were read in error. The number of bits in error may be referred to as an error bit count. Various mechanisms may be used to detect a number of cells or bits in a page that were read in error. For example, the system may determine a fail bit count representing a number of bits that are determined to be in error in the page. The fail bit count may be determined using parity checks or other mechanisms. In one embodiment, an error correction code (ECC) or ECC information associated with the data may be used to determine the fail bit count or the number of bit errors that have occurred within the data.

At step 634, the system adds memory blocks to a queue based on the errors determined at step 632. In one embodiment, the system adds memory blocks to a read scrub queue based on read errors. For example, the system may determine if the fail bit count of a page satisfies (e.g., is above) a threshold. If the page has a FBC that satisfies the threshold, the system adds the corresponding block to the read scrub queue. If the page does not have a FBC that satisfies the threshold, the system does not add the corresponding block to the read scrub queue.

At step 636, the system filters blocks exhibiting cross-temperature effects but not read disturb effects. The system can mark the blocks to not receive a maintenance operation. The system can mark the blocks to not receive a read scrub operation. In one example, the system can remove blocks from a read scrub queue. The system can determine a read error associated with a set of memory cells such as a selected page of a block in one embodiment. The system may determine an error bit rate such as a fail bit count as described at step 632. The system then compares the error bit rate with a threshold. For any blocks that do not satisfy the threshold, the system remove a designation that the block is to be reprogrammed. For example, the system can remove a block from the read scrub queue that was earlier added at step 634.

In one embodiment, the system performs an additional read operation at step 636 using a compensated or adjusted set of read levels to determine the error. The compensated set of read levels includes at least one read level that is adjusted from the default read level for a corresponding state. In one embodiment, the compensated set of read levels may include one or more default read levels. For example, the compensated set may include a default read level for state A, and adjusted read levels for states B and C.

The adjusted set of read levels may include a set of read levels used to detect whether a memory cell is programmed to one of a plurality of states. The system may determine whether the memory cell has a threshold voltage above or below each of the read levels. The system may use a default set of read values when sensing for the default set of read levels. The system may use a default set of levels (voltage or current) applied to the selected word line, the unselected word lines, bit lines, source lines, etc. during sensing. The set of read values may also include a sense time that a sense amplifier uses in detecting the threshold voltage The system may determine whether the memory cell has a threshold voltage above or below each of the adjusted read levels. In one example, sensing at a compensated read level is performed by applying an adjusted read voltage to the selected word line during sensing for a state. In another example, sensing at a compensated read level is performed by applying the default read voltage to a selected word line and applying one or more compensation read values to another portion of the memory. For example, the system may adjust a bit line voltage or a sense time while applying the default read voltage to the selected word line. The adjusted bit line voltage or sense time results in sensing at the adjusted read level while applying the same read voltage to the selected word line.

At step 638, the system performs the maintenance operation for blocks that are identified after filtering. In one embodiment, data scrubbing is performed for blocks that are identified for a read scrub operation after filtering. These blocks have a FBC above the threshold when sensing with temperature compensation at step 636. Accordingly, the system reads the data from the identified blocks and rewrites the data in the same or a different memory location in one embodiment.

FIG. 13 depicts a process where temperature compensation is used to filter blocks that have already been identified for a maintenance operation. Temperature compensation can alternately or additionally be used to initially identify a block for a maintenance operation, for example when testing to determine whether to initially add a group of memory cells to a queue for a maintenance operation.

Figure 14:
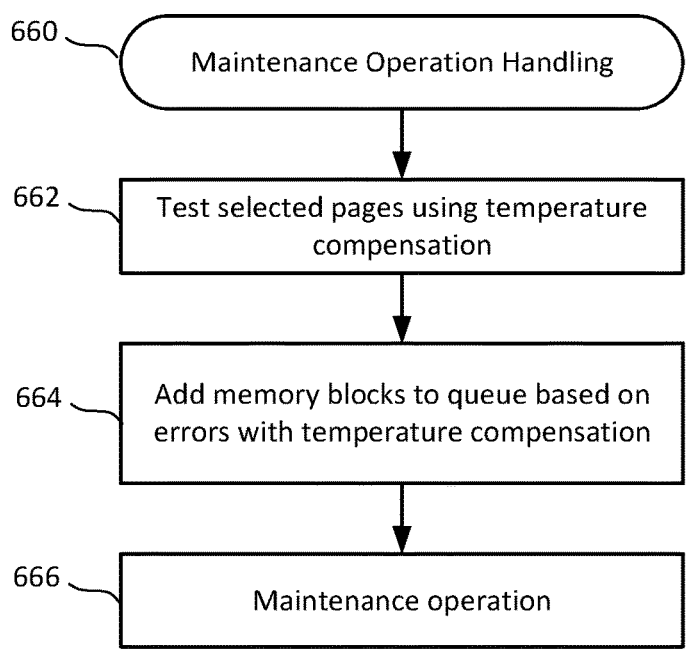
FIG. 14 is a flowchart describing a process of read scrub handling in accordance with one embodiment.

FIG. 14 depicts a process 660 of maintenance operation handling where temperature compensation is applied during testing to determine whether to initially add a block to a queue. In one embodiment, process 630 is performed by control circuit 110, controller 122, and/or control circuit 950. Process 630 is one example of using temperature compensation to determine whether to add a group of memory cells to a queue for a maintenance operation such as reprogramming. The disclosed process can be used to determine whether to perform any maintenance operations, such as data refreshing, data scrubbing, or reprogramming.

At step 662, the system tests a set of memory cells, such as a set of memory cells storing one or more pages of a selected block. In one embodiment, testing includes sensing, reading, or verifying the set of memory cells. The system uses temperature compensation when testing at step 662. In one embodiment, the system uses an adjusted or compensated set of sense parameters as part of reading or verifying. In one embodiment, the system reads one or more pages of a selected block. The system can perform a read operation at step 662 using a compensated or adjusted set of read levels. The compensated set of read levels includes at least one read level that is adjusted from the default read level for a corresponding state.

At step 662, the system determines an error associated with testing the memory cells. In one embodiment, the system determines a read error associated with each page that is read at step 662. For example, the system may determine a fail bit count representing a number of bits that are determined to be in error in the page.

At step 664, the system adds memory blocks to a queue based on the errors determined at step 662. In one embodiment, the system adds memory blocks to a read scrub queue based on read errors. For example, the system may determine if the fail bit count of a page satisfies (e.g., is above) a threshold. If the page has a FBC that satisfies the threshold, the system adds the corresponding block to the read scrub queue. If the page does not have a FBC that satisfies the threshold, the system does not add the corresponding block to the read scrub queue.

At step 666, the system performs the maintenance operation for blocks that are identified after filtering. In one embodiment, data scrubbing for blocks that are identified in the read scrub queue is performed. These blocks have a FBC above the threshold when sensing with temperature compensation at step 662. Accordingly, the system reads the data from the identified blocks and rewrites the data in the same or a different memory location in one embodiment.

FIG. 14 shows an example where temperature compensation is applied during a scan phase, but is not later applied after a block is added to a scrub queue. In another example, the processes in FIG. 13 and FIG. 14 can be combined. The system can test using temperature compensation to determine whether to initially add blocks to a queue as shown in step 662 of FIG. 14. The system can later reread memory cells from the block to filter blocks from the queue as shown at step 636 of process 630.

FIG. 15 is a table showing a set of compensated read reference levels in accordance with one embodiment. FIG. 15 is one example of a dynamic read table that includes temperature compensations for sensing for a plurality of data states A, B, and C. In this example, the dynamic read table includes adjusted read reference levels for multiple cases that can be used for sensing. The table of FIG. 15 can be used to perform sense operations for a plurality of cases, with each case including a unique subset of read reference levels. For example, when sensing using temperature compensation, the system can sense using the read reference levels for each case and determine a fail bit count for each case. The system then selects the lowest fail bit count from sensing for the different cases. The lowest fail bit count is then used to determine whether to add or remove a group of memory cells from the read scrub queue. In one embodiment, the table of FIG. 15 can be used to perform temperature compensated reads as shown at steps 636 and/or 662 of FIGS. 13 and 14.

The specific example of FIG. 15 shows five cases (0-4), each having a unique combination of read reference levels for states A, B, and C. The system can perform sensing using the read reference levels for each case. A fail bit count is determined for each case and the system selects the lowest fail bit count from all of the cases.

In FIG. 15, the default read reference levels are shown and each case shows an adjustment in my from the default level for each state. Case 0 provides no adjustment to the default read reference level Vra, a 100 mv (positive) adjustment is provided to the default read reference level Vrb for state B, and a 100 mv adjustment is provided to the default read reference level Vrc for state C. The system can sense using the case 0 read reference levels and determine a fail bit count. The system then senses use the read reference levels for case 1. Case 1 provides no adjustment to Vra, a 150 mv adjustment to Vrb, and a 150 mv adjustment to Vrc for state C. The system determines a fail bit count and continues the process for each of the cases. In FIG. 15, adjustments to default reference levels are stored. In another example, adjusted reference levels are stored directly.

In the example of FIG. 15, each case includes the same adjustment to states B and C. In other examples, the adjustment for each state may be different. For example, case 1 may use a 150 mv adjustment for state B as shown, but a 100 mv adjustment for state C. The particular adjustments for a state can be selected by characterizing a device and determining a set of adjustments that compensate for cross-temperature effects more than read disturb effects.

The dynamic read table is used to determine the appropriate reference levels to use during sensing. For example, the table may be used to determine sets of adjusted read voltages that are applied to a selected word line during sensing. The table can be used at step 636 of process 630 when reading to determine whether to remove blocks that have been designated for reprogramming. The table can be used at step 662 of process 660 to determine whether to designate blocks for reprogramming. The table can be used at step 712 of process 700 to read a selected page with temperature compensated read levels. The table can be accessed to determine the temperature compensated read levels by providing the indicated adjustment to the default read level for each state.

In one example, the adjustments in FIG. 15 can be used to provide adjusted read voltages for sensing at the various states. A similar table may be used to provide adjustments to other sense parameters. For example, a table may include adjustments to sense times, bit line voltages, etc. for the different states. The adjustments to the sense parameters result in sensing at an adjusted reference level.

The dynamic read table may be used by controller 122, control circuitry 110, and/or read/write circuits 128 during sensing. In one embodiment, the dynamic read table is used by test circuit 954. Read/write circuits 128 can use the adjustments in the table to determine appropriate levels for sensing. The dynamic read table may be stored within any suitable memory. In one example, the table is stored in code/parameters storage 113. In one example, the table is stored in ROM 122a, RAM 122b, and/or RAM 216, accessible to controller 122. The dynamic read table may additionally or alternately be stored in memory accessible to control circuitry 110 and/or read/write circuits. The dynamic read table may be stored in non-volatile memory and placed into volatile memory for quick access by the various circuits. In one example, the adjustments are determined by controller 122 and/or control circuitry 110 and provided to read/write circuits.

The particular adjustments provided in the dynamic read table can be determined by characterizing a device in one example. Various adjusted read reference levels can be used and the results of sensing at the different levels compared. A set of adjusted read levels that provide improved error rates under cross-temperature effects, but that do not provide as much improvement under read-disturb effects can be selected. The table can be defined during the characterization process and stored in the non-volatile storage device for later use. In this manner, a device characterization can be done independently and statically loaded to a device at any time without requiring firmware updates. In one example, a characterization is performed for one or more devices that is then applied to a larger group of devices. As such, the table can be built once and then stored by multiple storage devices. In another example, an individual device is characterized and a table is built for the particular device.

In one example, the table includes a number of rows equal to a number of different cases corresponding to different compensations. The table includes a number of columns equal to a number of states for which an adjustment is provided to the default read level. Although a table is shown, any suitable data structure may be used to store a dynamic read table.

In another example, the table does not include entries for every state. For example, because no adjustments are provided for the state A level, the entries for the reference level VrA may be omitted. In this manner, the system does not store adjustments or temperature compensations for all of the states. For example, the system may store temperature compensations for states B and states C, but not for state A. In this manner, the system stores one or more temperature compensations for sensing that include compensations for less than all of the data states. Because temperature compensations are not stored for all states, a reduced table size and increased performance using the table are available in certain embodiments.

FIG. 15 shows an example of adjustments that increase read reference levels. Increased read reference levels may be used when reading memory cells at a lower temperature than the temperature when the memory cells were programmed. As earlier described, higher temperatures during a read operation may cause the threshold voltage (or resistance) of a memory cell to decrease. Accordingly, one embodiment includes adjustments that decrease one or more read levels.

Adjustments that decrease a read level can compensate for temperature effects when reading at a higher temperature than a temperature at which memory cells where programmed. In one example, a dynamic read table includes one or more cases with entries that provide adjustments that target reading at higher temperatures. The entries may include adjustments that provide lower read levels than default read levels.

In one embodiment, the system does not detect temperature. The system applies the adjustments in the table without regard to actual temperature. The table may include one or more cases that correspond to a condition when the memory is being read at a lower temperature than when it was read (increased reference levels). The table may include one or more cases that correspond to a condition when the memory is being read at a higher temperature than when it was read (decreased reference levels).

In one embodiment, the system detects a temperature when reading. The system then applies adjustments from the table that correspond to the particular condition under which the memory is being read. If the system detects that a current temperature is below a temperature at which the corresponding memory was programmed, the system applies one or more compensated reference levels that are greater than corresponding default reference levels. If the system detects that the current temperature is greater than a temperature at which the corresponding memory was programmed, the system applies one or more compensated reference levels that are less than corresponding default reference levels.

In one embodiment, the system includes a temperature sensor. The temperature sensor detects a temperature when programming and stores an indication of the programmed temperature. The indication can be stored as one or more bits within the memory it describes, or can be stored in another location (e.g., in a table). When reading, the temperature sensor detects the current temperature. The test circuit can then access the current temperature and the programmed temperature to use in the test process.

Figure 16:
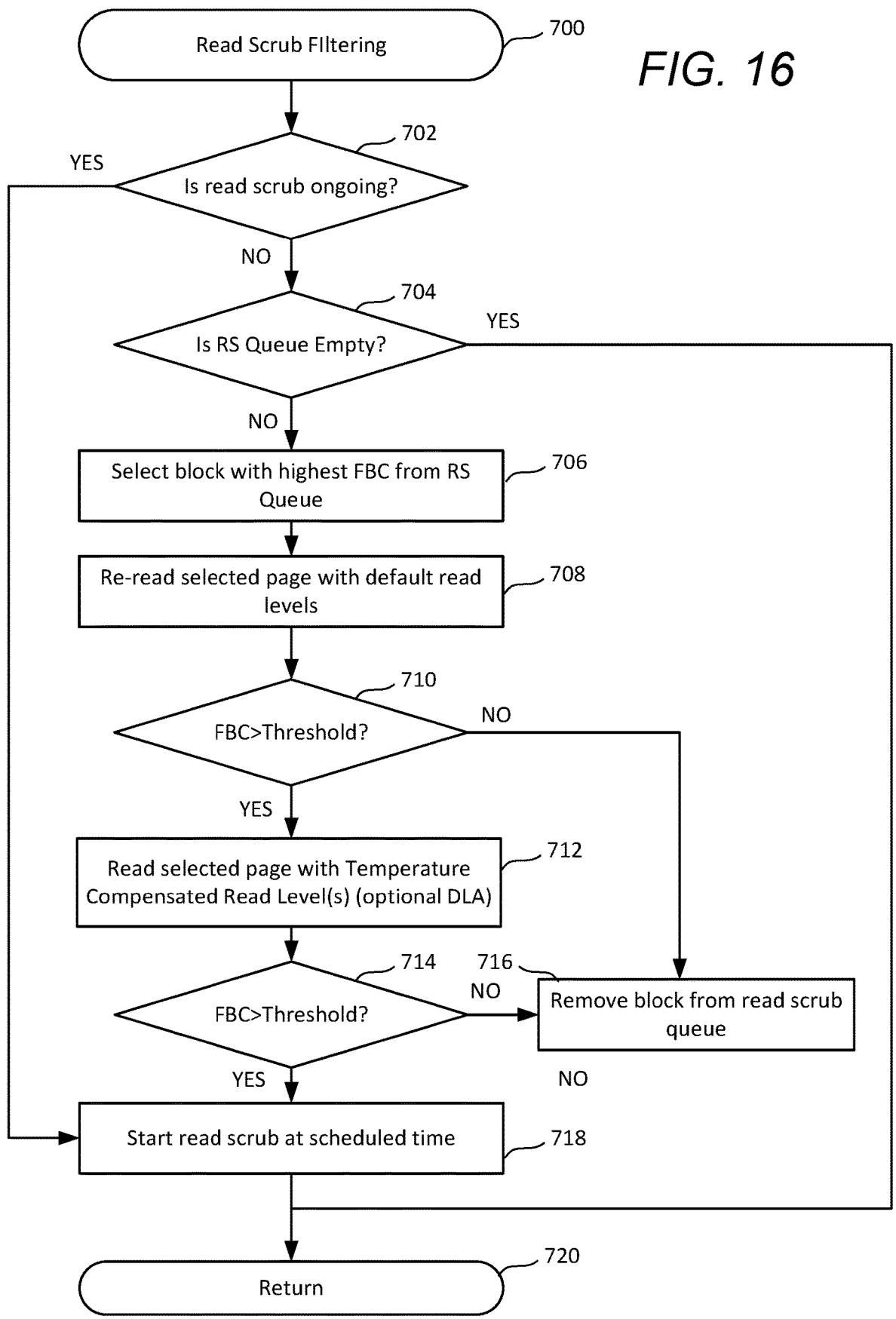
FIG. 16 is a flowchart describing a process of read scrub handling including temperature-based filtering in accordance with one embodiment.

FIG. 16 is a flowchart describing a process 700 of read scrub handling according to one embodiment. In one embodiment, process 700 can be used to filter blocks from a read scrub queue that were previously identified for read scrubbing. Process 700 can be performed at step 636 of FIG. 13 in one example to filter blocks of memory cells from a read scrub queue based on errors associated with a temperature compensated read process. In one embodiment, process 700 is performed by control circuit 110, controller 122, and/or control circuit 950. Process 700 is one example of using compensated read levels to determine whether a previously identified group of memory cells should be removed from a read scrub queue for reprogramming. FIG. 16 depicts a process for determining whether to perform a read scrub operation. The disclosed process can also be used to determine whether to perform other maintenance operations, such as data refreshing.

At step 702, the system determines whether a read scrub process is currently ongoing. In many implementations, read scrub operations are scheduled to only occur after a specified number of host read commands and/or to occupy a limited amount of time. Such limitations can avoid decreased system performance due to overutilization of resources for background operations. Accordingly, step 702 may include determining whether the system is already performing a scrub operation. If a scrub operation is ongoing, the system proceeds to step 718 and begins the scrub operation at the scheduled time. The system may scrub the block that is associated with the highest fail bit count from the scan phase. The system reads and reprograms a portion of the block at step 718. The system may perform multiple reads and reprograms to fully reprogram a block. For example, the time allotted for a scrub may be considerably smaller than the time required to scrub an entire block. Accordingly, the system at step 718 begins the scrub process for portions of the block. Multiple read and program operations may be scheduled to scrub an entire block.

If a read scrub is not ongoing, the system determines whether the read scrub queue is empty at step 704. If the RS queue is empty, the process 700 returns at step 720.

If the RS queue is not empty, the system selects the block with the highest FBC from the RS queue at step 706. At step 708, the system re-reads the selected page using the set of default read levels. The system determines an amount of error associated with reading at the default read levels. The system can use ECC or other mechanisms to determine a fail bit count associated with reading the selected page.

At step 710, the system compares the fail bit count with a threshold such as a CECC limit. If the fail bit count does not satisfy the threshold (e.g, is below the threshold), the corresponding block is removed from the read scrub queue at step 716. The system may delete an identifier of the block from the queue in one example.

Steps 708-710 are one example of testing without temperature compensation and removing a designation for cells that do not satisfy a threshold without temperature compensation. At step 708, the system tests without temperature compensation. Cells that are read in error may naturally return to their initial program levels if the temperature returns to near the temperature when the cells were programmed. Testing without temperature compensation may be used because the temperature difference that existed when a block was initially designated for a maintenance operation may no longer exist. For example, a block initially may be designated in response to testing at a temperature that is lower than the temperature when the memory was programmed. Later, the temperature may return to the level when the memory was programmed. As such, testing without temperature compensation may result in detection of cross-temperature effects simply because the ambient temperature has returned or is near to its programming level. Accordingly, step 708 is performed without temperature compensation and an error is determined. If the error does not satisfy the threshold, the system removes the block from the RS queue at step 716 after recognizing that the block was initially added to the RS queue because of cross-temperature effects, not read disturb. (e.g., step 632 of FIG. 13).

If the system determines that the FBC satisfies (e.g., is at or above) the threshold at step 710, it re-reads the selected page using temperature compensation at step 712. The system may use a set of compensated read levels. For example, the system may use a set of compensated read levels including one or more read levels that are adjusted relative to the default read levels for the corresponding states. The set of compensated read levels may include the default read level for one or more states. For example, the set may include a default read level for the lowest programmed state (e.g., state A) and an adjusted read level for each of the other programmed states. The system may optionally apply an additional direct look-ahead (DLA) compensation to an adjacent word line to provide compensation based on word line interference.

The system determines a read error such as a fail bit count associated with reading using the set of compensated read levels. The system can apply multiple sets of compensated read levels as shown in the dynamic read table of FIG. 15 in one embodiment. The system applies the set of levels and determines the fail bit count associated with each set. The system can determine the lowest FBC and select the corresponding case as the best case. The system uses the lowest FBC in determining whether to remove a block of memory cells from the RS queue.

At step 714, the system determines whether the FBC determined at step 712 satisfies the threshold. If the FBC does not satisfy the threshold (e.g., drops below the threshold), the system removes the block from the read scrub queue at step 716. The system determines that the temperature compensation led to the page of memory cells not satisfying the FBC threshold for read scrubbing. As such, the system removes the block from the RS queue at step 716 so that it will not undergo read scrubbing.

If the FBC satisfies the threshold, the system begins the read scrub for the selected block at the scheduled time for the next read scrub operation at step 718. After performing the read scrub process for the given time, the process returns at step 720.

FIGS. 17A and 17B are charts illustrating one technique for selecting a set of adjusted read reference levels to use when applying temperature compensation. FIG. 17A is a table illustrating the accuracy of using various read reference levels to sense memory that has experienced read disturb. In the table, the level of the state A read reference level VrA is shown in the first column as an offset from the default level. The state reference VrA is swept from a −50 mv offset from the default level, to a +300 mv offset from the default level. The first row shows the level of the State C read reference level VrC as an offset from the default level VrC. Each cell in the table shows the number of sectors that pass (are not read in error) a threshold criteria when sensing at the given VrC and VrA levels.

Similarly FIG. 17B is a table illustrating the accuracy of using various read reference levels to sense memory that has experienced cross-temperature effects. In the table, the state A reference level VrA is swept from a −150 mv offset from the default level, to a +200 mv offset from the default level. The first row shows the level of the State C read reference level VrC as an offset from the default level VrC, being swept from a −50 mv offset to a 300 mv offset. Again each cell in the table shows the number of sectors that pass (are not read in error) a threshold criteria when sensing at the given VrC and VrA levels.

From the two tables, mutually exclusive regions can be identified that correspond to sense levels that can be used to detect the corresponding read disturb or cross-temperature effects.

With reference to FIGS. 17A and 17B, it can be seen that that sensing at the state A reference level VrA is more affected by read disturb when compared with cross-temperature effects. In region 808 in FIG. 17A, the number of passing sectors is low and is not spread across the different state C reference levels for VrC. However, region 810 illustrates that the number of passing sectors is high and is spread across the varying levels for state A. This illustrates that providing an adjustment to the state A reference level VrA during sensing has a large compensating effect for read disturb effects.

By contrast, regions 812 and 814 in FIG. 17B shows that sensing at the state A reference level is not largely affected by cross-temperature effects, but that sensing at the state C reference level is. Region 812 illustrates that the number of passing vectors is high at the default VrA level, and is spread across a varying level for VrC. Region 814 illustrates that that number of passing sectors is low and is not spread across the different state A reference levels.

Thus, it can be seen that the number of passing sectors is spread more in the VrA direction for read disturb compared to cross-temperature. Additionally, it can be seen that the number of passing sectors is spread more in the VrC direction for cross-temperature compared to read disturb. Accordingly, one embodiment provides positive adjustments to the VrC reference level without providing adjustments to the VrA level. In this manner, the system compensates for cross-temperature effects without providing as much compensation for read disturb effects.

Figure 18A:
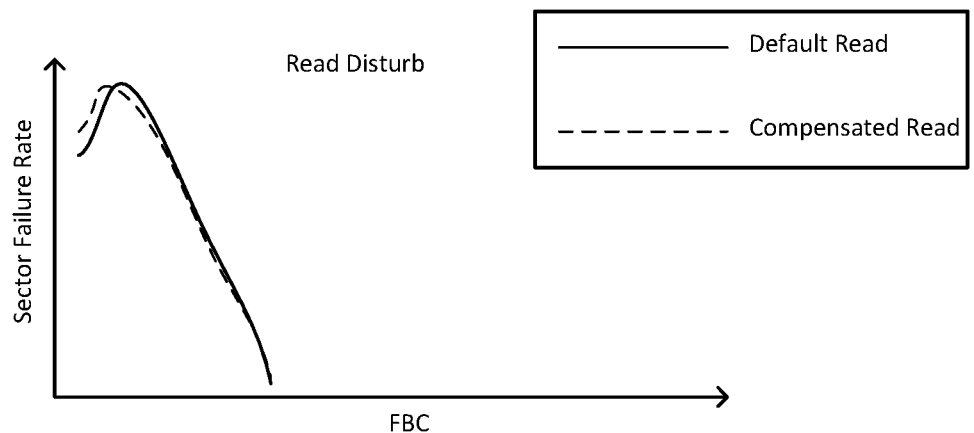
FIG. 18A is a chart depicting sector failure rates for read-disturbed memory cells when read with default and compensated read levels.
Figure 18B:
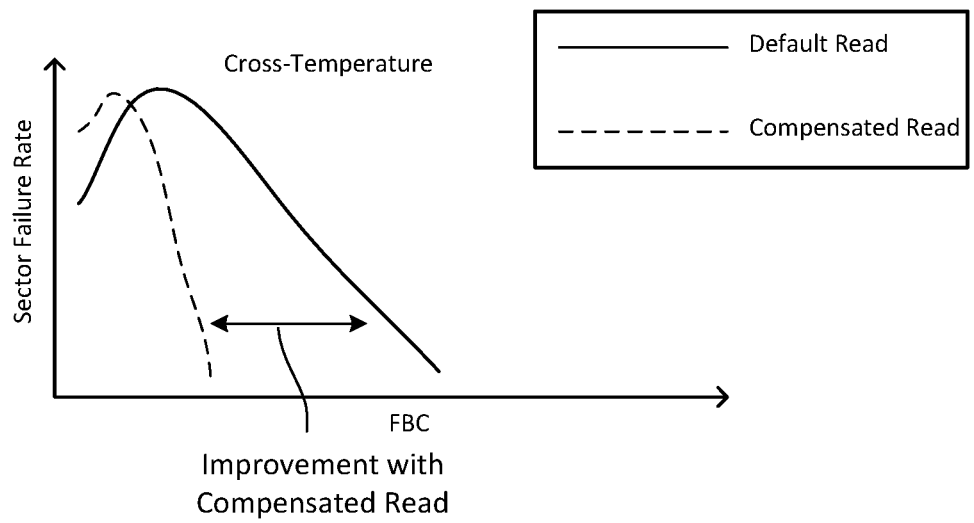
FIG. 18B is a chart depicting sector failure rates for temperature-effected memory cells when read with default and compensated read levels.

FIGS. 18A and 18B are charts showing the results of using temperature compensation to read memory cells. FIGS. 18A and 18B show the sector failure rate as a function of the fail bit count. In FIG. 18A, the sector failure rate is shown for a group of memory cells that have undergone read disturb. In FIG. 18A, the results of reading a page of memory cells is shown when using a set of default read levels (solid line) and a set of compensated read levels. As illustrated, the sector failure rate is roughly the same across the various fail bit counts. FIG. 18A illustrates that using the disclosed temperature compensation values does not affect the sector failure rate for read disturbed memory cells.

In FIG. 18B, the sector failure rate is shown for a group of memory cells that have undergoing a cross temperature variation (e.g., program at 85 degrees and read and −40 degrees). When using the set of default read levels (solid line), it can be seen that the sector failure rate is large across a range of fail bit counts. When using the temperature compensated read levels (dotted line), however, the sector failure rate is improved and is limited to a small range of fail bit counts. FIG. 18B illustrates that the temperature compensated read improves the sector failure rate compared to the default read values. Together, FIGS. 18A and 18B illustrate that using a temperature compensated read as disclosed provides a significant improvement when reading temperature affected cells and therefore, can be used to discriminate temperature-affected cells from read disturb cells to more accurately perform read disturb processes.

Figure 19:
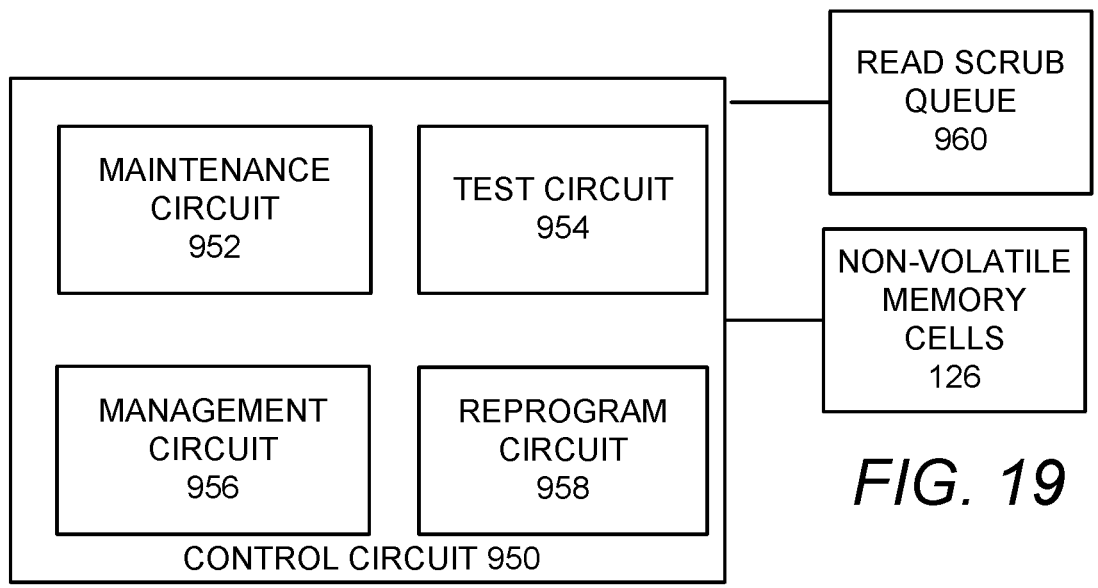
FIG. 19 is a block diagram of a control circuit in accordance with one embodiment.

FIG. 19 is a block diagram of one example of a set of components that can be used to implement embodiments of the disclosed technology. FIG. 19 depicts a control circuit 950 in communication with memory cells 126 and a read scrub queue 960. In one embodiment, control circuit 950 is implemented as part of control circuit 110 shown in FIG. 1. In another embodiment, control circuit 950 is implemented as part of controller 122 of FIGS. 1 and 2. In yet another embodiment, control circuit 650 is implemented as part of control circuitry 110 and controller 122. Control circuit 950 may access firmware or other instructions to implement the functions of the variously described circuits.

FIG. 19 is one example of components that can be used to perform the processes of FIGS. 13, 14, and/or 16. FIG. 19 is one example of a set of components that can use the dynamic read table in FIG. 15. FIG. 19 is an example of components that can be used to read a group of memory cells and provide temperature compensation to determine whether the group should be subjected to a maintenance operation.

FIG. 19 depicts control circuit 950 in communication with non-volatile memory cells 126 and read scrub queue 960. In one embodiment, memory cells 126 can include memory cells in a two dimensional structure or three dimensional structure (e.g., such as the structure depicted in FIGS. 4A-F). Any of various non-volatile technologies known in the art can be used to implement memory cells 126. In one embodiment, read scrub queue 960 comprises a data structure that either stores or includes identifiers of blocks or other groups of cells to be reprogrammed. In one embodiment, membership of a group of cells in the read scrub queue 960 serves to indicate that the group of cells is to be reprogrammed. The read scrub queue 960 can be maintained in memory accessible to control circuit 950. In one example, the read scrub queue 960 is stored in the memory cells 126, but it will be appreciated that the read scrub queue 960 may be maintained in other memory such as memory 216 or 218 accessible to control circuitry. In another embodiment, the read scrub queue 960 is implemented as flags or other identifiers stored with, or separately from, the group of memory cells they identify.

Control circuit 950 includes maintenance circuit 952, test circuit 954, management circuit 956, and reprogram circuit 958. Maintenance circuit 952 is configured to identify a set of memory cells storing data to be reprogrammed. Maintenance circuit 952 can access read scrub queue 960 to determine memory cells that have been identified for reprogramming. In another example, maintenance circuit 952 can mark or designate a set of memory cells for reprogramming, and remove a marking and/or designation in response to a compensated read. In one embodiment, maintenance circuit 952 is used to perform all or a part of step 702 and/or 704 of FIG. 16.

Various means for identifying a set of non-volatile memory cells to be reprogrammed can be used. An identifying means may include a read scrub queue and/or a means for marking or designating memory cells. The identifying means may include a dedicated circuit, such as a dedicated circuit within control circuit 950 in one example. The identifying means may also or alternately include software control means implemented with a processor or logic circuitry for example.

Test circuit 954 is configured to test a set of memory cells to determine an error bit rate. Testing by the test circuit comprises testing the set of memory cells to determine an error. The test circuit can test the set of memory cells at various times. The test circuit may test the set independently as part of a test process. The test circuit may test the set as part of other memory operations. The test circuit may test the set of memory cells as part of a host read operation, as part of a program verify operation, during a soft read operation, and/or during a read scan. The test circuit may read user data as part of testing to determine an error, or may determine an error without reading user data. The test circuit may determine an initial error bit rate using default read levels and/or an error bit rate using compensated read levels. The test circuit may determine an error bit rate as part of a read scan. In one embodiment, test circuit 954 performs all or a part of step 636 of FIG. 13, step 662 of FIG. 14, and/or step 712 of FIG. 16 for a read scan operation.

In one embodiment, test circuit 954 includes a pre-test circuit configured to test a set of memory cells to determine an initial error bit rate without compensating for a temperature difference. In one embodiment, control circuit 950 includes a pre-test circuit separate from test circuit 954. In one example, the pre-test circuit tests without temperature compensation to determine if a previous cross-temperature effect is no longer present. For example, cells that are initially read in error may naturally return to their initial program levels if the temperature returns to the programmed temperature. The temperature difference that existed when a block was initially designated for a maintenance operation may no longer exist. Testing without temperature compensation may result in detection of earlier cross-temperature effects if the ambient temperature returns to its programmed level.

In one embodiment, test circuit 954 includes a read circuit configured to read data from the memory cells. In another embodiment, the test circuit accesses a read circuit that is not part of the test circuit to determine an error. In one example, the test circuit may use the read circuit used for a host initiated read in order to determine an error. In one example, the test circuit may access the read circuit to determine an error as part of a test process. In one example, the test circuit may access the read circuit to determine an error associated with a host read. The read circuit can determine an error associated with reading memory cells. The read circuit may read a set of memory cells in response to a reprogramming designation associated with a group of memory cells. The read circuit may perform sense processes as part of reading or verifying memory cells, as described herein. In one embodiment, a read circuit is configured to read a set of memory cells and determine an error associated with reading the set. In one embodiment, a read circuit is used to perform all or a part of step 632 of FIG. 13. A read circuit can be used to perform all or a part of steps 706 and/or 708 of FIG. 16. Additionally, a read circuit may be used at steps 638, 666, and/or 718 to read data from memory cells as part of reprogramming the data during a data scrub process.

Test circuit 952 may include a sense circuit for sensing as part of reading, verifying, monitoring, probing, or any other process that determines a memory cell's state or condition. The sense circuit can determine an error associated with sensing memory cells. The sense circuit may sense a set of memory cells in response to a reprogramming designation associated with a group of memory cells. The sense circuit may perform sense processes as part of reading or verifying memory cells, as described herein. In one embodiment, a sense circuit is configured to sense a set of memory cells and determine an error associated with reading the set. Test circuit 952 is configured to read groups of memory cells, such as a page of data from a page of memory cells in non-volatile memory cells 126. Test circuit 952 includes a sense module 580 in one embodiment.

In one example, test circuit 954 includes a compensation circuit configured to compensate for a temperature difference between when the cells are programmed and when the test circuit performs the test. In one example, the compensation circuit is configured to compensate for temperature changes as part of testing to determine an error.

A compensation circuit can apply one or more temperature compensations while a selected word line or memory cell is sensed. A compensation circuit is one example of a compensation means, also referred to as a means for applying a temperature compensation as part of reading to determine an error. In one example, the temperature compensation compensates for cells that are programmed at a first ambient temperature and read at a different second ambient temperature.

Test circuit 952 is one example of means for determining an error associated with reading a set of memory cells. Various means for testing a set of non-volatile memory cells to determine an error bit rate can be used. A testing means may include reading means to determine a programmed state of a selected memory cell. The testing means may include a dedicated circuit, such as a dedicated circuit within control circuit 950 in one example. The testing means may also or alternately include software control means implemented with a processor or logic circuitry for example. The test circuit may be a part of or include a sense circuit and/or compensation circuit.

Management circuit 956 is configured to mark sets of memory cells to receive a maintenance operation in response to an error bit rate of the set satisfying a threshold. The management circuit can mark sets of memory cells to not receive a maintenance operation in response to an error bit rate not satisfying a threshold. In one embodiment, the management circuit is configured to remove a reprogramming designation associated with a set of memory cells in response to an error being below a threshold. In one embodiment, the management circuit is configured to manage a read scrub queue, such as by adding, maintaining, and/or removing memory cells from the queue. Management circuit 956 is one example of a management means. The management means may include a dedicated circuit, such as a dedicated circuit within control circuit 950 in one example. The management means may also or alternatively include software control means implemented with a process or logic circuitry for example. The management circuit may be a part of or include a read circuit. In one embodiment, the management circuit performs all or a part of step 634 of FIG. 13, step 636 of FIG. 13, and/or step 664 of FIG. 13. In one embodiment, the management circuit performs all or a part of steps 702, 704, 706, 710, 714, and/or 716 of FIG. 16.

Reprogram circuit 958 is configured to reprogram data from memory cells that have been identified for reprogramming. In one embodiment, reprogram circuit 958 is configured to reprogram data of a set of memory cells base on a read error satisfying a threshold. Reprogram circuit 958 is one example of a reprogram means, also referred to as a means for reprogramming data from the set of memory cells into the plurality of memory cells in response to the error satisfying a threshold. Various means for reprogramming may be used. The reprogram circuit may include a dedicated circuit, such as a dedicated circuit within control circuit 950 in one example. A reprogram means may also or alternatively include software control means implemented with a process or logic circuitry for example. In one embodiment, the reprogram circuit performs all or a part of step 638 of FIG. 13 and/or step 666 of FIG. 14. In one embodiment, the reprogram circuit performs all or a part of step 718 of FIG. 16.

Shifts in the apparent charge stored by a charge storage region such as charge trap layer in a non-volatile storage element also can occur because of word line interference based on charge stored by adjacent storage elements. To account for the shift, different compensations can be applied to an adjacent word line when reading a selected word line based on different possible conditions of cells on the adjacent word line. In one embodiment, the system additionally applies compensation to a neighboring word line to compensate for word line interference. For example, step 712 may include applying compensation to a neighboring word line while applying a read reference voltage to a selected word line.

The technique of applying compensation to a neighboring word line for correction of coupling effects during read may be referred to as a direct look ahead ("DLA") scheme. A correction or compensation is applied while reading a selected cell that takes into account the condition of the adjacent memory cell on the adjacent word line. A compensation is effected by biasing the adjacent word line WLn+1 such that the resultant coupling offsets the effects of programming WLn+1, reducing or eliminating errors during reading the selected word line WLn.

The sense level is adjusted virtually by biasing an adjacent word line based on its programmed state or more generally, its relative programmed condition. This enables the correct state to be read from the selected memory cell in spite of perturbing charges that are subsequently programmed into neighboring memory cells. In one embodiment, biasing an adjacent word line based on its programmed state can be used with a temperature compensated read reference level for the selected word line.

Figure 20A:
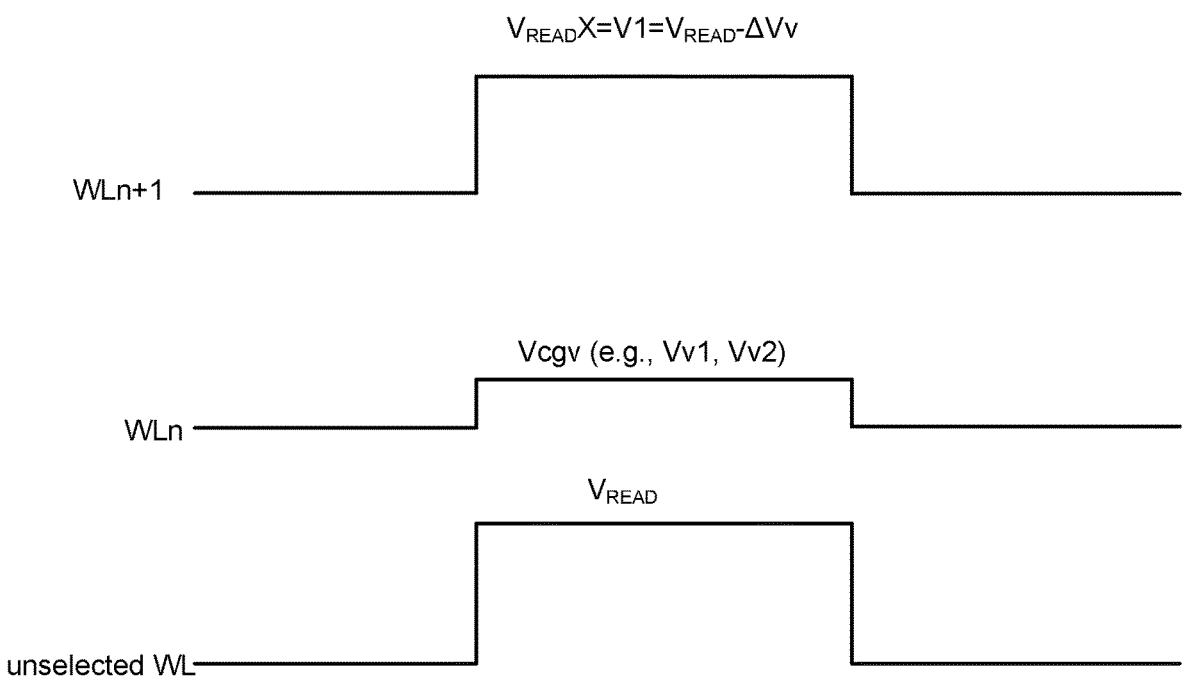
FIG. 20A is a timing diagram depicting the conditions during program verify for a direct look ahead compensated read scheme.
Figure 20B:
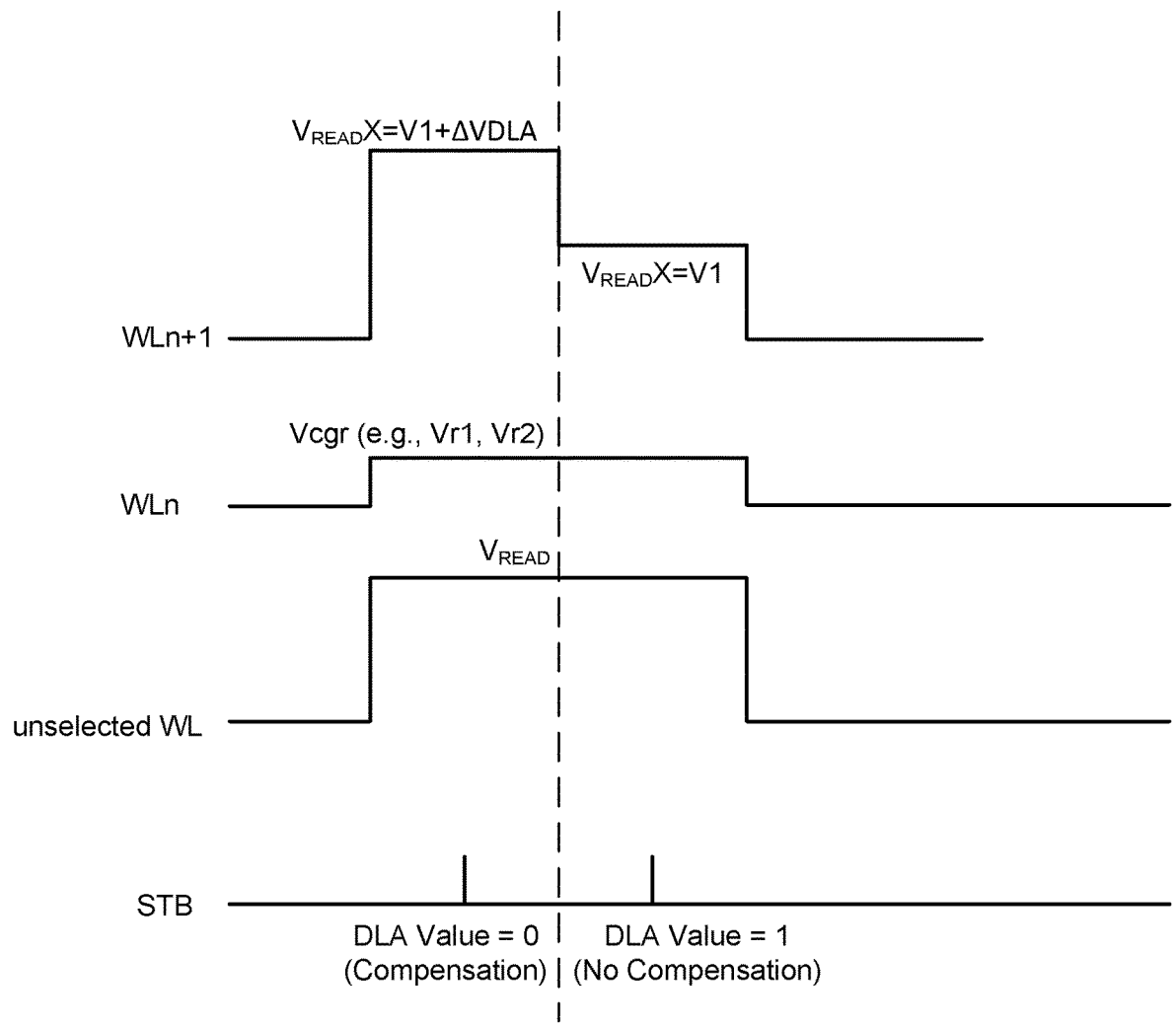
FIG. 20B is a timing diagram depicting bias conditions during a compensated read.

FIG. 20A and FIG. 20B illustrate an example of biasing on a selected word line and adjacent word lines WLn+1 and WLn−1 during a program verify and a subsequent read, respectively. FIG. 20A illustrates biasing conditions under a DLA scheme during program verify for the selected word line WLn, the adjacent word line WLn+1, and the other unselected word lines WL. During program verify, the sensing voltage level applied to WLn is one of Vv1, Vv2, . . . (see FIG. 5). In the case of a NAND cell, the neighboring cells immediately below and above the cell to be sensed are part of the same NAND string (see FIG. 4F.) Therefore a voltage sufficient to turn on the neighboring cells, VREAD, is applied to all unselected word lines. In one embodiment, however, since the cells on WLn+1 are in the erased state, the biasing on WLn+1 is reduced to VREADX=V1 which is substantially lower than the normal VREAD, while still being able to turn on the cells on WLn+1. This depressed basic level will allow a differential bias boost to be applied in a subsequent read operation without having to apply an excessive word line voltage. In one embodiment, V1 is equal to VREAD−$\Delta$VV, where $\Delta$VV is an offset to reduce VREAD by an amount to enable subsequent compensation increases.

FIG. 20B illustrates the biasing conditions under a DLA scheme during a compensated read for the word line being sensed and its adjacent word lines. In particular, WLn is the selected word line among a NAND string (see FIG. 4F). During sensing, a selected read reference voltage Vcgr (e.g., Vr1, Vr2, . . . ) is applied to the selected word line WLn. The rest of the unselected word lines except for WLn+1 will have a voltage VREAD to turn on the other cells in the NAND chain. The word line WLn+1 will have a voltage bias VREADX applied to it. The voltage bias is applied as two read pass voltages VREADX=V1 and VREADX=V1+$\Delta$VDLA. V1 is equal to the pass voltage VREADX=V1 applied during verify so that no compensation will be applied. $\Delta$VDLA is an offset that increases VREADX by an amount over V1 to effect a compensation. VREADX may include several voltages to apply different levels of compensation based on the state of the adjacent memory cell.

In general, VREADX is dependent on the programmed condition of an adjacent memory cell on WLn+1. The more programmed the neighboring state, the more perturbation and the more compensation that is used. The example shows two possible compensation levels coded by one bit. Additional read pass voltages can be applied to WLn+1 to provide additional compensation levels.

V1 corresponds to a situation where the selected memory cell is sensed with no compensation. The pass bias VREADX is the same as in program verify at V1. If an adjacent memory cell is below a predetermined programmed threshold, the results of sensing the selected memory cell while applying V1 to WLn+1 are selected. When the adjacent cell at WLn+1 is less programmed with the total perturbation below the predetermined threshold, no compensation is employed (DLA value "1"). Therefore the biasing of WLn+1 is the same as in the program verify case with VREADX=V1.

Compensation is effected by using a larger pass bias by raising VREADX from V1 to V1+ΔVDLA. When the neighboring cell is in a more programmed state, with the total perturbation above a predetermined threshold for example, the results of sensing the selected memory cell while applying V1+ΔVDLA are selected. When the adjacent cell at WLn+1 is more programmed with the total perturbation above the predetermined threshold, the results including compensation are used (DLA value '0'). In this case, compensation is effected by raising the biasing on WLn+1 by a predetermined amount with VREADX=V1+ΔVDLA.

While a DLA read has been illustrated with one bit correction having two compensation levels, it is clear that more accurate sensing at WLn+1 can be used to provide more compensation levels that will render the compensation more precise. As described earlier with the DLA sensing scheme, the selected word line WLn and the adjacent word line WLn+1 are both read. The states or conditions of cells on WLn+1 are first determined by first sensing WLn+1 in order to know which sensing results to use for each selected memory cell on WLn. For a finer correction based on multiple programmed levels of the adjacent cells, WLn+1 is sensed multiple times, each time for one of the multiple levels.

It is noted that the unselected word lines other than WLn+1 may receive the same VREAD pass voltage as described above, or may receive different pass voltages. For example, the programmed word lines WL0-WLn−1 may receive a relatively higher pass voltage than the unprogrammed word lines WLn+2 through the last programmed word line.

An apparatus according to one embodiment has been described, comprising a plurality of memory cells, a maintenance circuit, a test circuit, and a management circuit. The maintenance circuit is configured to identify a set of memory cells storing data to be reprogrammed. The set of memory cells have a projected error bit rate. The test circuit is configured to test the set of memory cells to determine an error bit rate. The test circuit comprises a compensation circuit configured to compensate for a temperature difference between when the cells are programmed and when the test circuit performs the test. The management circuit is configured to mark the set of memory cells to receive a maintenance operation in response to the error bit rate satisfying a threshold.

An apparatus according to one embodiment has been described, comprising a plurality of memory cells, a read circuit configured to read a set of memory cells of the plurality and determine an error associated with reading the set, a compensation circuit configured to compensate for temperature changes as part of reading to determine the error, and a reprogram circuit configured to reprogram data of the set of memory cells based on the error satisfying a threshold.

A method has been described that includes reading at least one set of memory cells from a group of cells in response to a reprogramming designation associated with the group. Reading includes at least one temperature compensation. The method further comprises determining that an error associated with reading the at least one set of memory cells is below a threshold, and removing the reprogramming designation associated with the group in response to the error being below the threshold.

An apparatus according to one embodiment has been described, comprising a plurality of memory cells, means for determining an error associated with reading a set of memory cells from the plurality, means for applying a temperature compensation as part of reading to determine the error, and means for reprogramming data from the set of memory cells into the plurality of memory cells in response to the error satisfying a threshold. The temperature compensation compensates for cells that are programmed at a first ambient temperature and read at a different second ambient temperature.

The foregoing detailed description has been presented for purposes of illustration and description. It is not intended to be exhaustive or to limit the subject matter claimed herein to the precise form(s) disclosed. Many modifications and variations are possible in light of the above teachings. The described embodiments were chosen in order to best explain the principles of the disclosed technology and its practical application to thereby enable others skilled in the art to best utilize the technology in various embodiments and with various modifications as are suited to the particular use contemplated. It is intended that the scope of the invention be defined by the claims appended hereto.

What is claimed is:

1. An apparatus, comprising:
a plurality of memory cells;
a maintenance circuit configured to identify a set of memory cells storing data to be reprogrammed;
a test circuit configured to test the set of memory cells to determine an error bit rate, the test circuit comprising a compensation circuit configured to compensate for a temperature difference between when the memory cells are programmed and when the test circuit performs the test; and
a management circuit configured to mark the set of memory cells to receive a scrub operation in response to the error bit rate exceeding a correctable error threshold.

2. The apparatus of claim 1, wherein:
the management circuit is configured to mark the set of memory cells to not receive the scrub operation, in response to the error bit rate not exceeding the correctable error threshold.

3. The apparatus of claim 2, further comprising,
a pre-test circuit configured to test the set of memory cells to determine an initial error bit rate without compensating for the temperature difference; and
the management circuit is configured to exclude the set of memory cells from the scrub operation in response to the initial error bit rate not exceeding the correctable error threshold.

4. The apparatus of claim 3, wherein:
the pre-test circuit is configured to determine the initial error bit rate by sensing the set of memory cells for a data state using a first reference level; and
the test circuit is configured to determine the error bit rate by sensing the set of memory cells for the data state using a second reference level, the second reference level higher than the first reference level.

5. The apparatus of claim 4, wherein:
the data state is a second data state;
the pre-test circuit is configured to determine the initial error bit rate by sensing the set of memory cells for a first data state using a third reference level, the first data state is associated with lower threshold voltages than the second data state; and
the test circuit is configured to determine the error bit rate by sensing the set of memory cells for the first data state using the third reference level.

6. The apparatus of claim 3, wherein:
the test circuit is configured to determine the initial error bit rate in response to determining that a reprogram queue includes the set of memory cells;
the management circuit is configured to remove the set of memory cells from the reprogram queue in response to the initial error bit rate not exceeding the correctable error threshold; and
the management circuit is configured to remove the set of memory cells in response to the error bit rate not exceeding the correctable error threshold.

7. The apparatus of claim 1, wherein the error bit rate is a selected error bit rate, the test circuit is configured to determine the selected error bit rate by:
performing a first read operation using a first set of read levels for a first set of states and determining a first error bit rate;
performing a second read operation using a second set of read levels for the first set of states and determining a second error bit rate, the first and second set of read levels including different read levels for a first state; and
selecting the lower of the first error bit rate and the second error bit rate as the selected error bit rate.

8. The apparatus of claim 1, wherein:
the test circuit is configured to compensate for the temperature difference as part of determining the error bit rate during a read scan; and
the management circuit is configured to mark the set of memory cells to receive the scrub operation by adding the set of memory cells to a reprogram queue.

9. The apparatus of claim 1, wherein the set of memory cells is a first set of memory cells, the apparatus further comprising:
a reprogram circuit configured to read data associated with the first set and program the data to a second set of memory cells.

10. The apparatus of claim 1, wherein:
the set of memory cells is part of a group of memory cells coupled to a plurality of word lines and a plurality of bit lines; and
the management circuit is configured to mark the group of memory cells to receive the scrub operation in response to the error bit rate exceeding the correctable error threshold.

11. The apparatus of claim 1, further comprising:
a plurality of NAND strings including the plurality of memory cells, the plurality of NAND strings are arranged in a three-dimensional structure;
a plurality of bit lines coupled to the plurality of NAND strings;
a plurality of word lines coupled to the plurality of NAND strings; and
a source line coupled to the plurality of NAND strings.

12. The apparatus of claim 1, wherein:
the test circuit is configured to determine a current temperature associated with the set of memory cells and a programmed temperature associated with the set of memory cells;
the test circuit is configured to determine the error bit rate by sensing the set of memory cells for a first data state using a first reference level, in response to the current temperature less than the programmed temperature; and
the test circuit is configured to determine the error bit rate by sensing the set of memory cells for the first data state using a second reference level, in response to the current temperature greater than the programmed temperature.

13. The apparatus of claim 1, further comprising:
a read table configured to store one or more temperature compensations for sensing a plurality of data states associated with the set of memory cells, wherein the one or more temperature compensations include compensations for less than all of the plurality of data states;
wherein the test circuit is configured to access the read table and determine the error bit rate by sensing the set of memory cells based on the temperature compensation.

14. An apparatus, comprising:
a plurality of memory cells;
a sense circuit configured to sense a set of memory cells of the plurality and determine an error associated with sensing the set;
a compensation circuit configured to compensate for temperature changes as part of sensing to determine the error; and
a reprogram circuit configured to reprogram data of the set of memory cells based on the number of errors exceeding a correctable error threshold.

15. The apparatus of claim 14, further comprising:
a reprogram queue configured to identify memory cells for reprogramming; and
a management circuit configured to retain the set of memory cells in the reprogram queue in response to the number of errors exceeding the correctable error threshold,
wherein the reprogram circuit is configured to reprogram the data of the set of memory cells in response to the reprogram queue including the set of memory cells after the compensation circuit applies the temperature compensation.

16. The apparatus of claim 14, wherein:
the compensation circuit is configured to compensate for temperature changes by using one or more compensated read levels during reading associated with the set.

17. The apparatus of claim 16, wherein:
the sense circuit is configured to apply a first default read voltage during sensing for a first state to determine the number of errors; and
the first state is associated with lower threshold voltages than a second state.

18. A method, comprising:
sensing at least one set of memory cells from a group of memory cells in response to a reprogramming designation associated with the group, wherein the sensing includes at least one temperature compensation;
determining that an amount of error associated with sensing the at least one set of memory cells is below a correctable error threshold; and
removing the reprogramming designation associated with the group in response to the amount of error being below the correctable error threshold.

19. The method of claim 18, wherein:
sensing with at least one temperature compensation comprises applying at least one compensated read voltage.

20. The method of claim 19, wherein the group is a first group and the amount of error is a first amount of error, the method further comprises:
determining that a second group of memory cells is associated with a reprogramming designation;

sensing at least one set of memory cells of the second group, wherein sensing the at least one set of the second group comprises using a default read voltage;

determining that a second amount of error associated with sensing the at least one set of the second group is below the correctable error threshold; and removing a reprogramming designation associated with the second group in response to the second amount of error being below the correctable error threshold.

21. The method of claim 19, wherein the amount of error is a second amount of error, the method further comprises:

sensing the at least one set from the group using a default read voltage prior to sensing with at least one temperature compensation; and determining that a first amount of error is above the correctable error threshold, wherein sensing with at least one temperature compensation is performed in response to determining that the first amount of error is above the correctable error threshold.

22. An apparatus, comprising:

a plurality of memory cells;

means for determining an amount of error associated with sensing a set of memory cells from the plurality;

means for applying a temperature compensation as part of sensing to determine the amount of error, wherein the temperature compensation compensates for cells that are programmed at a first ambient temperature and read at a different second ambient temperature; and means for reprogramming data from the set of memory cells into the plurality of memory cells in response to the amount of error satisfying a correctable error threshold.

\* \* \* \* \*